(12) United States Patent
Asnaashari et al.

(10) Patent No.: US 10,050,629 B1
(45) Date of Patent: Aug. 14, 2018

(54) MULTI-BUFFERED SHIFT REGISTER INPUT MATRIX TO FPGA

(71) Applicant: Crossbar, Inc., Santa Clara, CA (US)

(72) Inventors: Mehdi Asnaashari, Danville, CA (US); Hagop Nazarian, San Jose, CA (US)

(73) Assignee: CROSSBAR, INC., Santa Clara, CA (US)

(*) Notice: Subject to any disclaimer, the term of this patent is extended or adjusted under 35 U.S.C. 154(b) by 0 days.

(21) Appl. No.: 15/610,829

(22) Filed: Jun. 1, 2017

Related U.S. Application Data

(60) Provisional application No. 62/345,082, filed on Jun. 3, 2016.

(51) Int. Cl.
| | |
|---|---|
| *H03K 19/17* | (2006.01) |
| *G11C 19/38* | (2006.01) |
| *H03K 19/177* | (2006.01) |
| *H03K 19/00* | (2006.01) |

(52) U.S. Cl.
CPC ......... *H03K 19/1776* (2013.01); *G11C 19/38* (2013.01); *H03K 19/0013* (2013.01); *H03K 19/17728* (2013.01); *H03K 19/17764* (2013.01); *H03K 19/17776* (2013.01); *H03K 19/17792* (2013.01); *H03K 19/17796* (2013.01)

(58) Field of Classification Search
CPC ............ G11C 13/0002; G11C 13/0028; G11C 13/003; G11C 2213/79; G11C 13/0026; G11C 14/0045; G11C 11/1659; G11C 11/1675; G11C 16/10; G11C 2013/0071; G11C 29/78; G11C 11/5628; G11C 19/38; H03K 19/1776; H03K 19/17792; H03K 19/17796; H03K 19/0013; H03K 19/17764; H03K 19/17776; H03K 19/00315; H03K 17/687
See application file for complete search history.

(56) References Cited

U.S. PATENT DOCUMENTS

| | | | | |
|---|---|---|---|---|
| 8,674,724 | B2 * | 3/2014 | Nazarian | H03K 19/1776 326/39 |
| 9,013,911 | B2 * | 4/2015 | Nazarian | G11C 11/5678 365/129 |
| 9,324,447 | B2 * | 4/2016 | Chung | G11C 17/16 |
| 9,466,362 | B2 * | 10/2016 | Yu | G11C 13/0026 |
| 9,508,441 | B1 * | 11/2016 | Nam | G11C 16/0483 |
| 9,600,410 | B1 * | 3/2017 | Nazarian | G11C 7/106 |
| 9,612,958 | B1 * | 4/2017 | Asnaashari | G11C 13/0069 |
| 9,620,206 | B2 * | 4/2017 | Nazarian | G11C 13/004 |
| 9,627,057 | B2 * | 4/2017 | Nazarian | G11C 13/0002 |
| 9,659,646 | B1 * | 5/2017 | Asnaashari | G11C 13/0069 |
| 9,698,201 | B2 * | 7/2017 | Nazarian | H01L 27/2463 |
| 9,727,258 | B1 * | 8/2017 | Nazarian | G06F 3/0619 |
| 9,729,155 | B2 * | 8/2017 | Nazarian | H03K 19/17764 |

* cited by examiner

*Primary Examiner* — Vibol Tan
(74) *Attorney, Agent, or Firm* — Amin, Turocy & Watson, LLP

(57) ABSTRACT

A method for an FPGA includes programming a RRAM memory array with a first bit pattern, shifting the first bit pattern to a shift register array, employing the first bit pattern in operation of the FPGA, programming a RRAM memory array with a second bit pattern concurrent the employing the bit pattern in operation of the FPGA, shifting the second bit pattern to the shift register array, and employing the second bit pattern in operation of the FPGA.

20 Claims, 15 Drawing Sheets

MULTI-BUFFERED SHIFT REGISTER INPUT MATRIX TO FPGA

CROSS-REFERENCE

The present disclosure claims the benefit of U.S. Provisional Application No. 62/345,082, filed on Jun. 3, 2016, entitled "MULTI-BUFFERED SHIFT REGISTER INPUT MATRIX TO FPGA"; the foregoing application is hereby incorporated by reference herein in its entirety and for all purposes.

BACKGROUND

The present disclosure relates to devices including field programmable gate arrays. A field programmable gate array (FPGA) is an integrated circuit that can be configured after manufacturing. It is a flexible device having a great number of potential configuration modes to interact with various other hardware and software designs (e.g., on a computer motherboard). The FPGA configuration is generally specified using a hardware description language, similar to that used for an application specific integrated circuit (ASIC). Generally speaking, an FPGA can be configured to implement most or all logic functions that an ASIC could execute, yet also can be at least partially reconfigured after shipping. Coupled with relatively low design costs typically associated with ASIC design, FPGAs offer significant advantages for a wide array of electronic devices and applications.

The FPGA architecture generally comprises a set of programmable logic components, or logic blocks, and reconfigurable interconnects for selectively connecting a subset of the logic blocks with other subsets thereof. Logic blocks can be configured to execute complex algorithms, or simple logic functions like AND, NAND, NOR, etc. Most FPGAs also include memory elements that can include flip-flops, memory registers, memory arrays, or the like.

Like most integrated circuits, design goals for the FPGA include reducing minimum component size, increasing calculation speed, lowering power consumption, and others. As more applications are found for these devices, demand for improved technology comes from many sectors. Although FPGAs were largely used exclusively in telecommunications and networking in early implementations, their versatility has found these devices implemented in other industries, consumer, automotive and industrial applications.

One recent development of the general FPGA architecture was to combine embedded microprocessors with the traditional logic blocks and interconnects of the FPGA. This development has lead to what are referred to as system-on-chip or system on programmable chip devices. Many examples of system-on-chip devices have emerged, generally combining processor and analog peripheral components with the FPGA architecture. The system-on-chip has enabled the miniaturization of microprocessors to achieve a new paradigm. However, as is typical with electronics technology, new paradigms very rapidly lead to applications requiring smaller, faster or lower power devices, generating new demand for research and development.

SUMMARY

The following presents a simplified summary of the subject disclosure in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

Various aspects of the subject disclosure provide a field programmable gate array (FPGA) utilizing resistive random access memory (RRAM) technology. The FPGA can comprise a switching block interconnect having a set of signal input lines and a set of signal output lines. One or more RRAM memory cells, a latch, and a switching transistor (also referred to as a pass gate transistor) are formed at respective intersections of the signal input lines and signal output lines. A plurality of latches can be coupled in series. One or more RRAM memory cells can be coupled to a first latch of the series of latches. An RRAM memory cell of the one or more RRAM memory cells can be selected to drive a signal having a voltage state reflective of a conducting state of the RRAM memory cell to an input of the first latch, which can be propagated to a selected latch of the series of latches. The voltage state is latched into the selected latch which can drive a gate of the switching transistor to conduct or not conduct according to the voltage state. The switching transistor is therefore configured to activate or deactivate the intersection.

According to particular aspects, an RRAM memory cell can comprise a programmable resistive element comprising programmable resistance material(s), which can be programmed to a high resistance state (non-conductive) or a low resistance state (conductive), and a transistor element that selectively couples the programmable resistive element to the latch based upon a signal. When the programmable resistive element is programmed to the low resistance state, the switching transistor associated is activated. When the programmable resistive element is programmed to the high resistance state, the switching transistor is deactivated. Also, the RRAM memory cell arrangement yields fast program and erase times for switching block intersections compared to conventional approaches, such as embedded Flash memories. Moreover, the RRAM memory cell of the subject disclosure yields low power consumption, significant die-size reduction and resistance or immunity to soft errors and electromagnetic radiation errors. Accordingly, various disclosed aspects provide significant improvements in FPGA technology.

According to one aspect of the invention, a field programmable gate array (FPGA) is disclosed. One apparatus includes a switching block routing array comprising a plurality of signal inputs and a plurality of signal outputs, and a first transistor element coupled to the switching block routing array, wherein the first transistor element comprises a gate, a first terminal and a second terminal, wherein the first terminal is coupled to a signal input from the plurality signal inputs, and wherein the second terminal is coupled to a signal output from the plurality of signal outputs, and wherein the gate is configured to electrically couple the signal input to the signal output in response to a gate control signal provided by an output of a latch coupled to the gate. A device may include a plurality of RRAM memory cells selectively coupled to an input of the latch (this can occur through selective propagation of the gate control signal through other latches in a series of latches to which the latch belongs), wherein each RRAM memory cell comprises a programmable resistive element with a first electrode and a second electrode, and a second transistor element that comprises another gate, another first terminal and another second terminal, wherein the first electrode is coupled to a select line, and wherein the other first terminal is coupled to the second electrode of the programmable resistive element, and wherein the other second terminal is coupled to an input of the latch and a bit line, and wherein the other gate is coupled to a word line, and wherein the other gate is configured to electrically couple the second electrode to the input of the latch in response to a word line select signal on the word line provided to the other gate. The programmable resistive element is characterized by a plurality of resistive states including a low resistive state and a high resistive state, wherein each programmable resistive element is characterized a polarity, wherein the polarity for each programmable resistive element is characterized by a low resistive state in response to a first voltage applied from the first electrode to the second electrode exceeding an program voltage and is characterized by a high resistive state in response to a second voltage applied from the second electrode to the first electrode exceeding an erase voltage, wherein a first electrode of the programmable resistive element is selectively coupled to a first plurality of voltages provided on the select line, wherein a second electrode of the programmable resistive element is selectively coupled to a second plurality of voltages provided on the bit line.

According to another aspect of the invention, a method for forming a field programmable gate array (FPGA) is disclosed. One methodology includes forming a first transistor element coupled to a switching block routing array comprising a plurality of signal inputs and a plurality of signal outputs, wherein the first transistor element comprises a gate, a first terminal and a second terminal, wherein the first terminal is coupled to a signal input from the plurality signal inputs, and wherein the second terminal is coupled to a signal output from the plurality of signal outputs, and wherein the gate is configured to electrically couple the signal input to the signal output in response to a gate control signal provided by an output of a latch coupled to the gate, forming a latch coupled to the first transistor element, and forming a plurality of RRAM memory cells with selective coupling to the latch (this can occur through selective propagation of the gate control signal through other latches in a series of latches to which the latch belongs), wherein each RRAM memory cell comprises a programmable resistive element with a first electrode and a second electrode, a second transistor element that comprises another gate, another first terminal and another second terminal, wherein the first electrode is coupled to a select line, and wherein the other first terminal is coupled to the second electrode of the programmable resistive element, and wherein the other second terminal is coupled to an input of the latch and a bit line, and wherein the other gate is coupled to a word line, and wherein the other gate is configured to electrically couple the second electrode to the input of the latch in response to a word line select signal on the word line provided to the other gate. The programmable resistive element is characterized by a plurality of resistive states including a low resistive state and a high resistive state, wherein each programmable resistive element is characterized a polarity, wherein the polarity for each programmable resistive element is characterized by a low resistive state in response to a first voltage applied from the first electrode to the second electrode exceeding an program voltage and is characterized by a high resistive state in response to a second voltage applied from the second electrode to the first electrode exceeding an erase voltage, wherein a first electrode of the programmable resistive element is selectively coupled to a first plurality of voltages provided on the select line, wherein a second electrode of the programmable resistive element is selectively coupled to a second plurality of voltages provided on the bit line.

According to yet another aspect of the invention. a process for operating an FPGA is disclosed. One technique includes applying a first input voltage at a first electrode of a programmable resistive element and applying a second input voltage at a second electrode of the programmable resistive element, wherein a difference between the first input voltage and the second input voltage meets a program voltage threshold that changes a resistance state of the programmable resistive element to a low resistance state, then applying a read voltage at the first electrode of the programmable resistive element, applying a low voltage at the second electrode of the programmable resistive element, applying a high voltage at the gate of a first transistor element coupled at a first terminal of the first transistor element to the second electrode and coupled at a second terminal of the first transistor element an input of a latch, and applying a high voltage at a latch enable input of the latch, thus allowing the read voltage to be seen at input of the latch, latched into the latch, and seen at another gate of a second transistor element coupled to an output of the latch, thereby electrically coupling another first terminal of the second transistor to another second terminal of the second transistor. Another technique includes coupling the first electrode of the programmable resistive element to another first input voltage and coupling the second electrode of the programmable resistive element to another second input voltage, wherein a difference between the other first input voltage and the other second input voltage meets an erase voltage threshold that changes a resistance state of the programmable resistive element to a high resistance state, then applying the read voltage at the first electrode of the programmable resistive element, applying the low voltage at the second electrode of the programmable resistive element, applying a high voltage at the gate of a first transistor element coupled at a first terminal of the first transistor element to the second electrode and coupled at a second terminal of the first transistor element an input of a latch, and applying a high voltage at a latch enable input of the latch, thus allowing the low voltage to be seen at the input of the latch, latched into the latch, and seen at another gate of the second transistor element coupled to an output of the latch, thereby decoupling the other first terminal of the second transistor to the other second terminal of the second transistor.

The following description and the annexed drawings set forth in detail certain illustrative aspects of the disclosed subject matter. These aspects are indicative, however, of but a few of the various ways in which the principles of the innovation can be employed and the disclosed subject matter is intended to include all such aspects and their equivalents. Other advantages and novel features of the disclosed subject matter will become apparent from the following detailed description of the innovation when considered in conjunction with the drawings.

DETAILED DESCRIPTION

Figure 1:
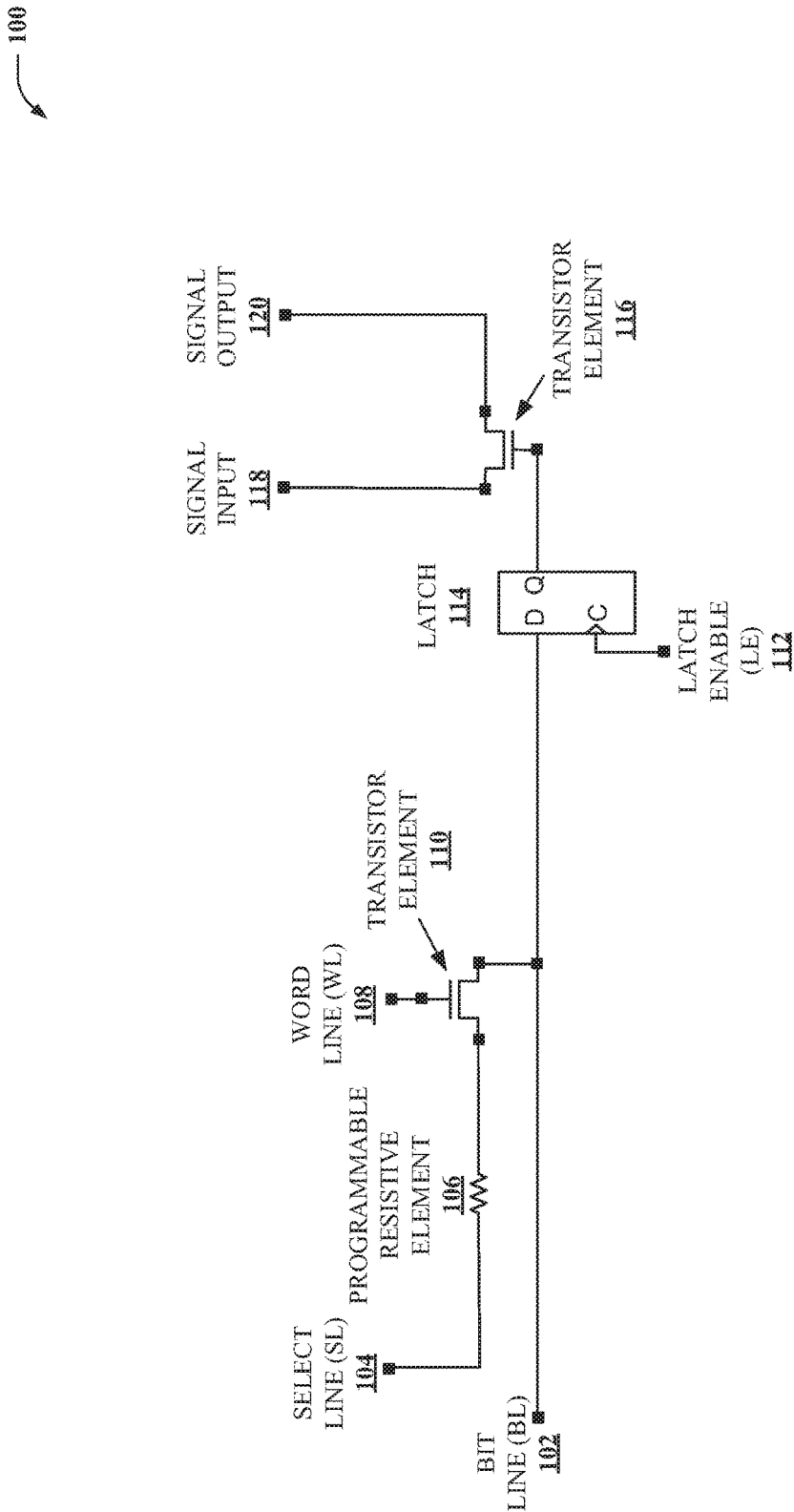
FIG. 1 illustrates a schematic diagram of a non-limiting example resistive random access memory (RRAM) configuration cell according to one or more aspects of the subject disclosure.

The disclosed subject matter is described with reference to the drawings, wherein like reference numerals are used to refer to like elements throughout the description. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram or schematic form in order to facilitate describing the subject innovation.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the claimed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the claimed subject matter.

Field programmable gate arrays (FPGAs) are employed in a wide range of electronic technology, serving as reconfigurable systems. In some applications, FPGAs can be integrated with microprocessors to serve as system-on-chip devices, which can be employed as a primary controller for various computer components, such as set top boxes and others. A wide range of uses for these devices exist, including telecommunications and networking, robotics, microelectronics, small-scale industrial manufacturing, consumer electronics including handset computers, smart-phones and personal digital assistants, and the like, as well as other applications and technologies. Additionally, new applications are invented routinely as capabilities of FPGA and FPGA-based devices improve.

One basic FPGA architecture is the programmable switching block, which acts as a programmable signal routing matrix. A switching block comprises a set of parallel signal input lines intersected by a set of perpendicular signal output lines. At a junction of respective signal input lines and signal output lines is a configuration cell (also referred to herein as a configuration bit). Activation and deactivation of subsets of configuration cells at respective signal input/signal output junctions facilitate configuration of a programmable switching block. Particularly, a configuration cell at a given junction can be activated to electrically connect or route a signal input line to a signal output line at that junction, or can be deactivated to electrically isolate the signal input line and signal output line at that junction. The ability to activate or deactivate respective junctions is the basis for configurability of the programmable switching block. Thus, for instance, a set of electrical components connected to the signal inputs and signal outputs can be selectively inter-connected by activating particular junctions and deactivating other junctions. This selective inter-connection can enable some functionality, while disabling other functionality, in effect configuring the programmable switching block for the enabled functionality (which is a subset of all possible functionality thereof).

One of the more common FPGA configuration cells is the SRAM configuration cell. Probably the most typical SRAM configuration cell comprises six or more transistors, referred to as a 6T SRAM cell. Four of the SRAM transistors form a pair of cross-coupled inverters, or latches. The SRAM cell has two stable states that denote respective states of a binary bit, 0 and 1. The remaining two transistors of the 6T SRAM cell control access to a storage cell during read and write operations, and are referred to as access transistors.

In addition to the basic 6T SRAM, other SRAM chips use eight transistors, ten transistors or more to store a single bit. Generally, the fewer transistors needed per cell the smaller the cell and the lower the cost of manufacture. The relatively large area of the 6T SRAM cell (often greater than $125F^2$—where F denotes the minimum feature size, such as 65 nanometer, etc.) increases cost of manufacture while reducing transistor density, as compared with technologies having smaller component size. In addition, SRAM is volatile memory, requiring continuous power to maintain stored information, and is susceptible to memory loss from high frequency electromagnetic radiation (e.g., cosmic rays, high frequency ultraviolet, X-Ray, etc.). Moreover, a system designed with SRAM based FPGA typically requires external Flash memory to configure the SRAM bits during power up sequence, slowing down the power up sequence, and further adding to manufacture costs and increasing chip size.

A recent innovation for integrated circuit technology has been the concept of a resistive random access memory (RRAM). In theory, RRAM is a non-volatile memory technology that induces a filament (or many filaments) in a dielectric material. In a normal state, the dielectric has high resistance, and is non-conductive. However, application of a suitable voltage across the dielectric can induce a conduction path therein. Various physical mechanisms enable generation of a conduction path in a dielectric, including defects in the material (whether natural or induced via doping), metal migration, and so on. Once the filament is formed within the dielectric, it can be activated—resulting in a low resistance conduction path through the dielectric—or deactivated—rendering the dielectric a high resistance electrical insulator—through application of a suitable program voltage. Thus, the conduction path can be referred to as a programmable conduction path, yielding similar electric characteristics as a conventional three-terminal transistor. In practice, however, the inventors of the present disclosure believe that conceptual models for RRAM have not been commercially successful in the past for reasons including incompatibility of RRAM fabrication materials with traditional CMOS processes, the incompatibility of RRAM processes as part of back end CMOS fabrication, and the like.

The inventors believe that a basic memory cell architecture employing the RRAM technology could be a configuration of bitlines intersected by overlying (or underlying) wordlines. A programmable resistance dielectric can be formed at the junction of each bitline and wordline. Such a basic memory cell would be referred to as a cross-point cell. One application of the RRAM cross-point cell, for instance, would be a block of reconfigurable interconnects within a FPGA. The RRAM cross-point cell can provide non-volatile RRAM memory cells to store information for configuration bits of the FPGA. The non-volatile cells would mitigate data loss in the event of power failure, provide radiation immunity, facilitate quicker power-up, as well as other benefits. In some embodiments, the non-volatile RRAM memory cells can comprise integral selector devices to improve a ratio of activated and deactivated resistance states to $10^6$ or greater, for sensitive application as one example. As an illustrative example, the selector device can be a FAST™ selector device under development by the current assignee of the present application for patent (e.g., see U.S. patent application Ser. No. 14/588,185 commonly assigned to the assignee of the present application for patent and hereby incorporated by reference herein in its entirety and for all purposes), although other selector devices (e.g., an Ovonic switch, a metal-insulator-transition (MIT) device, a MOTT insulator, etc.) can be employed consistent with one or more embodiments as well.

Aspects of the subject disclosure provide alternatives to configuration cells comprised exclusively of SRAM memory or other volatile switches, in various embodiments. In one aspect, a programmable switching block is formed from resistive random access memory (RRAM) in conjunction with a latch. RRAM, being non-volatile memory, provides the capacity to store data without continuous application of power. Therefore, FPGAs utilizing non-volatile embedded RRAM as configuration bits can have a much faster power up cycle than configuration bits exclusively comprising SRAM or other volatile switches, since additional non-volatile memory external to the FPGA is generally not required to prevent data loss. In addition to the foregoing, RRAM cells can generally be built between metal interconnect layers, enabling RRAM FPGAs to be usable for two-dimension as well as three-dimension FPGA architectures.

According to further aspects, the RRAM-based configuration cell comprises programming circuitry that is independent of signal input and signal output lines of an associated FPGA programmable switching block. The independent programming circuitry can improve input signal to output signal propagation performance since the programming circuits are not generating additional load capacitance and leakage on the input signal and output signal lines.

Referring now to the drawings, FIG. 1 illustrates a non-limiting example schematic diagram of an example RRAM configuration cell 100 according to various aspects of the subject disclosure. RRAM configuration cell 100 can be employed as a component of various electronic systems and architectures, including a FPGA device. In at least one aspect of the subject disclosure, RRAM configuration cell 100 can be employed for a programmable switching block, for instance, involved with activating or deactivating signal input and output junctions thereof.

RRAM configuration cell 100 can comprise transistor elements 110 and/or 116. Transistor elements 110 and/or 116 can comprise a gate-driven transistor having relatively high cutoff ratio. Examples of transistor elements 110 and/or 116 can include an NMOS transistor, a PMOS transistor, or a CMOS transistor (e.g., an NMOS+PMOS transistor), or other suitable three-terminal transistor. In at least one aspect of the subject disclosure, transistor elements 110 and/or 116 can be selected for suitable electrical characteristics, including switching speed, power consumption, cutoff ratio (e.g., about $10^6$, about $10^7$, or greater), or the like, or a suitable combination thereof. The electrical characteristics can be matched to an anticipated application or group of applications in which RRAM configuration cell 100 is intended for use.

Further, transistor elements 110 and/or 116 have at least a gate and a channel region with a first terminal and a second terminal. The gate of transistor element 110 can be driven by a signal on wordline (WL) 108. Wordline (WL) 108 therefore controls activation/deactivation states of transistor element 110.

RRAM configuration cell 100 can also comprise latch 114. Latch 114 can be a D-type flip-flop, in various embodiments, although other suitable logic circuits can be employed within the scope of the subject disclosure. Latch 114 can comprise an input D, and output Q, and a latch enable input C. The gate of transistor element 116 can be driven by a signal from output Q. Output Q therefore controls activation/deactivation states of transistor element 116. Latch enable input C is coupled to a latch enable line (LE) 112. An enable signal on latch enable line (LE) 112 drives latch enable input C to enable latch 114 to output a voltage seen at input D to output Q. A first terminal (e.g., source, drain) of transistor element 116 is coupled to signal input 118 (e.g., of an input/output junction of an FPGA) and a second terminal of transistor element 116 (e.g., drain, source) is coupled to signal output 120 (e.g., of the input/output junction of the FPGA). Input D of latch 114 is coupled to a second terminal of transistor element 110 and to a bit line (BL) 102.

RRAM configuration cell 100 can also comprise a programmable resistive element 106 having programmable resistances. For instance, programmable resistive element 106 can have at least a first programmable resistance and a second programmable resistance, where the second programmable resistance is a different resistance value from the first programmable resistance. In an aspect of the subject disclosure, programmable resistive element 106 can be programmed or erased to have the first or second programmable resistances (e.g., low resistance and high resistance). A first electrode of programmable resistive element 106 can be coupled to a select line 104 and a second electrode of programmable resistive element 106 can be coupled to a first terminal of transistor element 110.

In a non-limiting example, an operational programming of programmable resistive element 106 is as follows. A disable voltage input (e.g. low voltage or ground voltage) is applied to latch enable (LE) 112 (e.g., to prevent a voltage at input D of latch 114 from being latched into latch 114 or transferred to output Q), a first voltage input (e.g. a high or program voltage) is provided on select line 104 and applied to the first electrode of programmable resistive element 106, a second voltage input (e.g., a low voltage or ground voltage) is applied to bit line 102, wherein a difference between the first input voltage and the second input voltage meets a program voltage threshold of programmable resistive element 106, and a word line select voltage input (e.g. enable voltage or high voltage) is a applied to word line (WL) 108. Transistor element 110 is therefore enabled and couples the second voltage input at bit line 102 to the second electrode of programmable resistive element 106. The program voltage is applied across programmable resistive element 106, thereby programming programmable resistive element 106 to a low resistance state.

In another non-limiting example, an operational erasing of programmable resistive element 106 is as follows. A disable voltage input (e.g. low voltage or ground voltage) is applied to latch enable (LE) 112 (e.g., to prevent a voltage at input D of latch 114 from being latched into latch 114 or transferred to output Q), a first voltage input (e.g. a low voltage or ground voltage) is provided on select line 104 and applied to the first electrode of programmable resistive element 106, a second voltage input (e.g., a high voltage or erase voltage) is applied to bit line 102, wherein a difference between the first input voltage and the second input voltage meets an erase voltage threshold, and a word line select voltage input (e.g. enable voltage or high voltage) is a applied to word line (WL) 108 to activate transistor element 110 and to couple the second voltage input applied at bit line 102 to the second electrode of programmable resistive element 106. This applies the erase voltage across programmable resistive element 106, thereby erasing programmable resistive element 106 to a high resistance state.

In a further non-limiting example, an operational example of transistor element 116 is as follows. A first voltage input (e.g. a moderate or read voltage, less than the program voltage threshold) is provided on select line 104 and applied to the first electrode of programmable resistive element 106, bit line 102 is left floating (e.g., no applied voltage), and a word line select voltage input (e.g. enable or high voltage) is applied to word line (WL) 108 to couple the second electrode of programmable resistive element 106 with input D of latch 114, and an enable voltage input (e.g. high voltage or enable voltage) is applied to latch enable (LE) 112 to shift a voltage at input D of latch 114 to output Q, thereby activating or deactivating transistor element 116 based on the voltage at input D. When programmable resistive element 106 is in a low resistance state the first voltage applied at select line 104 is observed at input D and shifted to output Q, activating transistor element 116. When programmable resistive element 106 is in a high resistance state, the first voltage is dropped across programmable resistive element 106 and a low voltage is observed at input D. This low voltage is shifted to output Q and in turn deactivates transistor element 116. A disable voltage input (e.g. low voltage or source voltage) is applied to latch enable (LE) 112 to latch a voltage at input D into latch 114.

Figure 2:
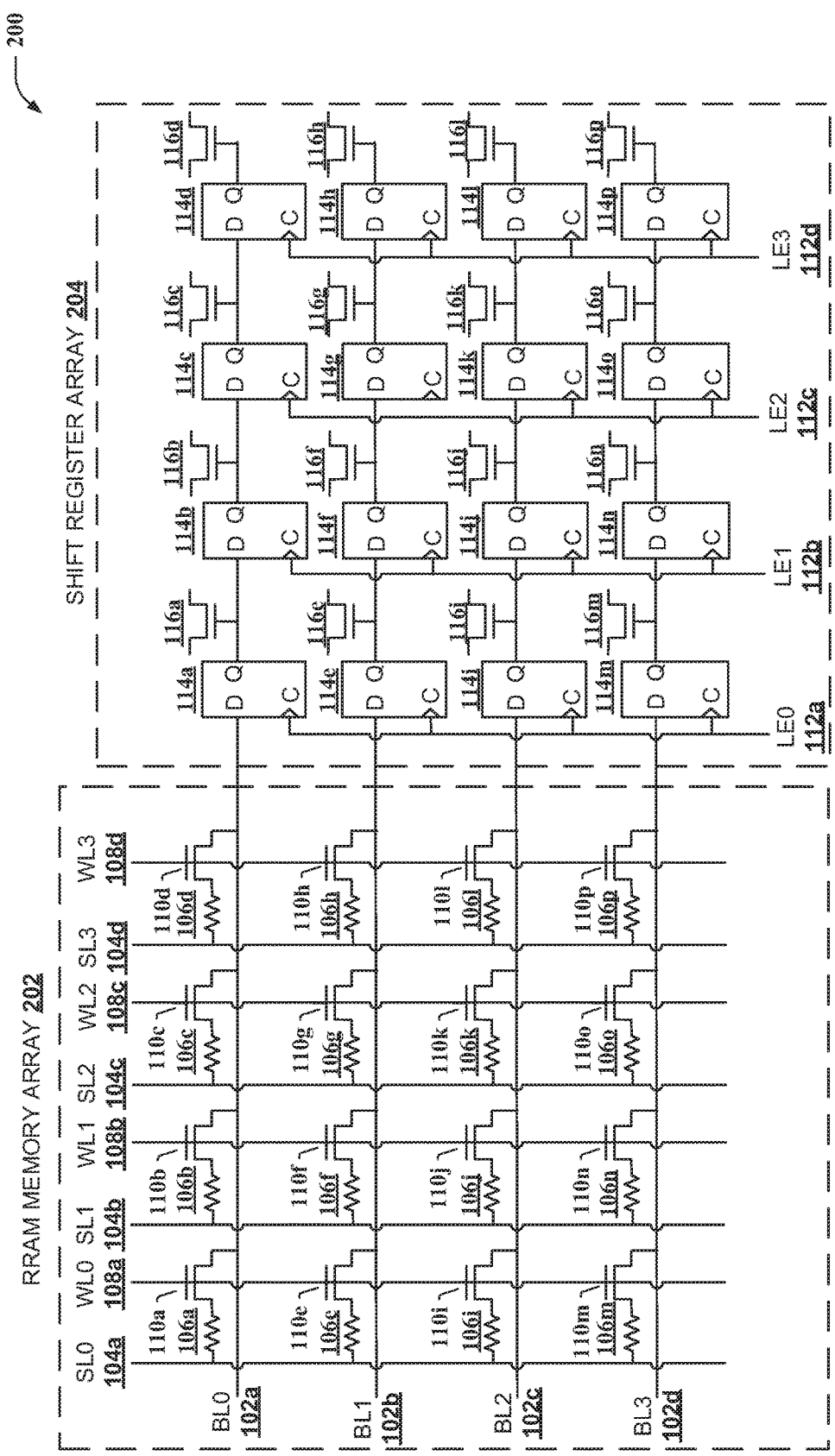
FIG. 2 illustrates a schematic diagram of a non-limiting example buffered shift register input matrix using a single RRAM memory array according to one or more aspects of the subject disclosure.

In an FPGA with hundred of thousands to millions of configuration junctions, using an RRAM configuration cell 100 for each junction scattered throughout all of the FPGA device can result in substantial space being wasted through duplication of circuitry for decode, Program, and Read operations and extra routing. In order to reduce wasted space and allow for increased density and/or smaller size, there is a need for the configuration cells 100 in a structured array format. FIG. 2 illustrates a non-limiting example schematic diagram of a buffered shift register input matrix 200 for an FPGA.

Buffered shift register input matrix 200 can comprise a RRAM memory array 202 and a shift register array 204. Buffered shift register input matrix 200 allows for a bit pattern programmed to shift register array 204 to configure an FPGA (e.g., by coupling/decoupling respective input/output junctions of the FPGA that are mapped to shift registers of shift register array 204). Once content of RRAM memory array 202 is shifted to shift register array 204 and FPGA is configured accordingly, the memory array 202 is no longer required for FPGA to perform certain operations and therefore the memory array 202 can be disabled or turned off to minimize power consumption. In one embodiment, operations can be performed by the FPGA while configured according to the bit pattern, while RRAM memory array 202 is programmed with a second bit pattern corresponding to a second operation. While programming the memory array 202 with the second bit pattern, the content of the shift register array 204 is not disturbed by applying disable voltage on the latch enable lines. The second bit pattern in RRAM memory array 202 can then be programmed (e.g, written, moved, copied, or shifted) into shift register array 204 when desired and at appropriate time, which allows FPGA to quickly perform another operation. FPGA should not be performing any operations while the shift register array 204 is being loaded. RRAM memory array 202 is non-volatile storage which will not lose a stored bit pattern upon loss of power to the FPGA, while shift register array 204 is volatile storage which can lose a stored bit pattern upon loss of power to the FPGA. Thus, advantageously, upon recovery of power, a bit pattern stored in RRAM memory array 202 can be quickly programmed into shift register array 204.

In a non-limiting example, RRAM memory array 202 and a shift register array 204 have the same or similar array dimensions. In examples presented herein, RRAM memory array 202 and shift register array 204 are depicted with an array dimension of 16 bits in a 4 by 4 bit pattern. However, the array dimension can comprise any suitable number of bits in any suitable bit pattern, non-limiting examples of which include a 2 by 2 bit pattern, a 8 by 8 bit pattern, a 16 by 16 bit pattern, a 2 by 4 bit pattern, a 8 by 4 bit pattern, a 16 by 8 bit pattern, a 36 by 4 bit pattern, or any other suitable bit pattern. Additionally, examples disclosed herein depict a D-latch in shift register array 204, however any suitable latch circuit can be employed.

RRAM memory array 202 comprises 16 pairs of programmable resistive element 106 and transistor element 110 coupled to each other as described above with respect to FIG. 1, and represented by (106a, 110a) . . . (106p, 110p) in a 4 by 4 matrix as depicted in FIG. 2. Transistor elements 110a, 110b, 110c, and 110d are coupled to bitline BL0 102a allowing a signal on BL0 102a to be applied concurrently at the second terminals of transistor elements 110a, 110b, 110c, and 110d. Transistor elements 110e, 110f, 110g, and 110h are coupled to bitline BL1 102b allowing a signal on BL1 102b to be applied concurrently at the second terminals of transistor elements 110e, 110f, 110g, and 110h. Transistor elements 110i, 110j, 110k, and 110l are coupled to bitline BL2 102c allowing a signal on BL2 102c to be applied concurrently at the second terminals of transistor elements 110i, 110j, 110k, and 110l. Transistor elements 110m, 110n, 110o, and 110p are coupled to bitline BL3 102d allowing a signal on BL3 102d to be applied concurrently at the second terminals of transistor elements 110m, 110n, 110o, and 110p.

Transistor elements 110a, 110e, 110i, and 110m are coupled to wordline WL0 108a allowing a signal on WL0 108a to be applied concurrently at the gates of transistor elements 110a, 110e, 110i, and 110m. Transistor elements 110b, 110f, 110j, and 110n are coupled to wordline WL1 108b allowing a signal on WL1 108b to be applied concurrently at the gates of transistor elements 110b, 110f, 110j, and 110n. Transistor elements 110c, 110g, 110k, and 110o are coupled to wordline WL2 108c allowing a signal on WL2 108c to be applied concurrently at the gates of transistor elements 110c, 110g, 110k, and 110o. Transistor elements 110d, 110h, 110l, and 110p are coupled to wordline WL3 108d allowing a signal on WL3 108d to be applied concurrently at the gates of transistor elements 110d, 110h, 110l, and 110p.

Programmable resistive elements 106a, 106e, 106i, and 106m are coupled to select line SL0 104a allowing a signal on SL0 104a to be applied concurrently at the first electrodes of programmable resistive elements 106a, 106e, 106i, and 106m. Programmable resistive elements 106b, 106f, 106j, and 106n are coupled to select line SL1 104b allowing a signal on SL1 104b to be applied concurrently at the first electrodes of programmable resistive elements 106b, 106f, 106j, and 106n. Programmable resistive elements 106c, 106g, 106k, and 106o are coupled to select line SL2 104c allowing a signal on SL2 104c to be applied concurrently at the first electrodes of programmable resistive elements 106c, 106g, 106k, and 106o. Programmable resistive elements 106d, 106h, 106l, and 106p are coupled to select line SL3 104d allowing a signal on SL3 104d to be applied concurrently at the first electrodes of programmable resistive elements 106d, 106h, 106l, and 106p.

Shift register array 204 comprises 16 pairs of latch 114 and transistor element 116 coupled to each other as described above with respect to FIG. 1, and represented by (114a, 116a) . . . (114p, 116p) in a 4 by 4 matrix as depicted in FIG. 2. Latch enable inputs C of latches 114a, 114e, 114i, and 114m are coupled to latch enable line LE0 112a allowing a signal on LE0 112a to be applied concurrently at the latch enable inputs C of latches 114a, 114e, 114i, and 114m. Latch enable inputs C of latches 114b, 114f, 114j, and 114n are coupled to Latch enable line LE1 112b allowing a signal on LE1 112b to be applied concurrently at the latch enable inputs C of latches 114b, 114f, 114j, and 114n. Latches 114c, 114g, 114k, and 114o are coupled to select line LE2 112c allowing a signal on LE2 112c to be applied concurrently at the latch enable inputs C of latches 114c, 114g, 114k, and 114o. Latches 114d, 114h, 114l, and 114p are coupled to select line LE3 112d allowing a signal on LE3 112d to be applied concurrently at the latch enable inputs C of latches 114d, 114h, 114l, and 114p.

Input D of latch 114a is coupled to bitline BL0 102a, input D of latch 114e is coupled to bitline BL1 102b, input D of latch 114i is coupled to bitline BL2 102c, and input D of latch 114m is coupled to bitline BL3 102d.

Input D of latch 114b is coupled to output Q of latch 114a, input D of latch 114c is coupled to output Q of latch 114b, input D of latch 114d is coupled to output Q of latch 114c, thereby latches 114a, 114b, 114c, and 114d are coupled in series. Input D of latch 114f is coupled to output Q of latch 114e, input D of latch 114g is coupled to output Q of latch 114f, input D of latch 114h is coupled to output Q of latch 114g, thereby latches 114e, 114f, 114g, and 114h are coupled in series. Input D of latch 114j is coupled to output Q of latch 114i, input D of latch 114k is coupled to output Q of latch 114j, input D of latch 114l is coupled to output Q of latch 114k, thereby latches 114i, 114j, 114k, and 114l are coupled in series. Input D of latch 114n is coupled to output Q of latch 114m, input D of latch 114o is coupled to output Q of latch 114n, input D of latch 114p is coupled to output Q of latch 114o, thereby latches 114m, 114n, 114o, and 114p are coupled in series.

In a non-limiting example, an operational programming of RRAM memory array 202 is as follows. A disable voltage input (e.g. low voltage or ground voltage) is applied to latch enable (LE) lines 112a, 112b, 112c, and 112d to prevent a voltage at inputs D of latches 114a . . . 114p from being latched into latches 114a . . . 114p or transferred to outputs Q, then iteratively until each of programmable resistive elements 106a . . . 106p are programmed or erased as appropriate for the desired resistance state, a program or erase operation is applied to each of programmable resistive elements 106a . . . 106p.

A program operation for a programmable resistive element can comprise a first voltage input (e.g. a high or program voltage) being applied on a select line (SL) coupled to the programmable resistive element and applied to the first electrode of programmable resistive element (other select lines associated with other programmable resistive elements are left to float in order to prevent the associated programmable resistive elements from changing resistance state). Concurrent to the first voltage input, a second voltage input (e.g., a low voltage or ground voltage) is applied to bit line (BL) coupled to a transistor element of the pair of programmable resistive element and transistor element (other bit lines associated with other programmable resistive elements are left to float in order to prevent the associated programmable resistive elements from changing resistance state), wherein a difference between the first input voltage and the second input voltage meets a program voltage threshold associated with the programmable resistive element. Concurrent to the first voltage input and the second voltage input, a word line select voltage input (e.g. enable voltage or high voltage) is applied to a word line (WL) coupled to a transistor element of the pair of programmable resistive element and transistor element (other word lines associated with other programmable resistive elements are left to float in order to prevent the associated programmable resistive elements from changing resistance state) to activate the transistor element and couple the second voltage input applied at the BL to the second electrode of the programmable resistive element, thereby applying the program voltage across the programmable resistive element and programming the programmable resistive element to a low resistance state.

For example, to program programmable resistive element 106c: a first voltage input (e.g. a high or program voltage) is provided on a select line SL2 coupled to the programmable resistive element 106c and applied to the first electrode of programmable resistive element 106c (select lines SL0, SL1, and SL3 are left to float), a second voltage input (e.g., a low voltage or ground voltage) is applied to bit line BL1 coupled to a transistor element 110f of the pair of programmable resistive element 106c and transistor element 110c (other bit lines BL0, BL2, and BL3 are left to float), wherein a difference between the first input voltage and the second input voltage meets a program voltage threshold, and a word line select voltage input (e.g. enable voltage or high voltage) is a applied to word line WL2 coupled to a transistor element 110c (other word lines WL0, WL1, and wL3 are left to float) to activate the transistor element and couple the second voltage input to the second electrode of programmable resistive element 106c, thereby applying the program voltage across the programmable resistive element and programming the programmable resistive element 106c to a low resistance state.

An erase operation for a programmable resistive element can comprise: a first voltage input (e.g. a low voltage or ground voltage) is provided on a select line (SL) coupled to the programmable resistive element and applied to the first electrode of programmable resistive element (other select lines associated with other programmable resistive elements are left to float in order to prevent the associated programmable resistive elements from changing resistance state), a second voltage input (e.g., a high voltage or erase voltage) is applied to bit line (BL) coupled to a transistor element of the pair of programmable resistive element and transistor element (other bit lines associated with other programmable resistive elements are left to float in order to prevent the associated programmable resistive elements from changing resistance state), wherein a difference between the first input voltage and the second input voltage meets an erase voltage threshold, and a word line select voltage input (e.g. enable voltage or high voltage) is a applied to word line (WL) coupled to a transistor element of the pair of programmable resistive element and transistor element (other word lines associated with other programmable resistive elements are left to float in order to prevent the associated programmable resistive elements from changing resistance state) to activate the transistor element and couple the second voltage input to the second electrode of the programmable resistive element, thereby applying the erase voltage across the programmable resistive element and programming the programmable resistive element to a high resistance state.

For example, to erase programmable resistive element 106n: a first voltage input (e.g. low voltage or ground voltage) is provided on a select line SL1 coupled to the programmable resistive element 106n and applied to the first electrode of programmable resistive element 106n (select lines SL0, SL2, and SL3 are left to float), a second voltage input (e.g., a high voltage or erase voltage) is applied to bit line BL3 coupled to a transistor element 110n of the pair of programmable resistive element 106n and transistor element 110n (other bit lines BL0, BL1, and BL2 are left to float), wherein a difference between the first input voltage and the second input voltage meets an erase voltage threshold, and a word line select voltage input (e.g. enable voltage or high voltage) is a applied to word line WL1 coupled to a transistor element 110n (other word lines WL0, WL2, and wL3 are left to float) to activate the transistor element and couple the second voltage input to the second electrode of programmable resistive element 106n, thereby applying the erase voltage across the programmable resistive element and programming the programmable resistive element 106n to a high resistance state.

In another non-limiting example, an operational programming of shift register array 204 with a bit pattern from RRAM memory array 202 is as follows. Voltage states representative of respective resistance states (e.g. data or bit values) of programmable resistive elements 106a . . . 106p are programmed into latches 114a . . . 114p on a column of programmable resistive elements to column of latches basis. In a non-limiting example, the columns of latches are programmed in order starting from the highest order column (e.g. LE3) to the lowest order column (e.g. LE0). When programming a column of latches, columns of lower order (e.g. preceding) than the column being programmed will have the states overwritten, while columns of higher order (e.g. subsequent to) than the column being programmed can have their states maintained, as will be described in more detail below. For example, data is shifted through the lower order columns to the column being programmed, but not beyond the column being programmed.

In a non-limiting example, latches 114d, 114h, 114l, and 114p associated with latch enable line LE3 are programmed first, then latches 114c, 114g, 114k, and 114o associated with latch enable line LE2 are programmed, followed by programming of latches 114b, 114f, 114j, and 114n associated with latch enable line LE1, and then latches 114*a*, 114*e*, 114*i*, and 114*m* associated with latch enable line LE0 are programmed. However, it is to be appreciated that the columns of latches can be programmed in any suitable order.

In a non-limiting example, a bit pattern from programmable resistive elements 106*a* . . . 106*p* can be programmed as a same bit pattern into latches 114*a* . . . 114*p*, such that the voltage state (e.g. data or bit value) of latch 114*a* is written to programmable resistive element 106*a*, and the data of latch 114*b* is written to the data of programmable resistive element 106*b*, . . . , the data of latch 114*p* is written to the data of programmable resistive element 106*p*. In another non-limiting example, a bit pattern from programmable resistive elements 106*a* . . . 106*p* can be programmed as a transposed bit pattern into latches 114*a* . . . 114*p*, such that the data of latch 114*a* is written to the data of programmable resistive element 106*d*, and the data of latch 114*b* is written to the data of programmable resistive element 106*c*, the data of latch 114*c* is written to the data of programmable resistive element 106*b*, the data of latch 114*d* is written to the data of programmable resistive element 106*a*, . . . , the data of latch 114*p* is written to the data of programmable resistive element 106*p*.

It is to be appreciated that data of any column of programmable resistive elements of RRAM memory array 202 can be programmed into any column of latches of shift register array 204. For example, data of programmable resistive elements 106*b*, 106*f*, 106*j*, and 106*n* can be programmed into the column of latches 114*a*, 114*e*, 114*i*, and 114*m*. In an alternative example, the data of programmable resistive elements 106*b*, 106*f*, 106*j*, and 106*n* can be programmed into the column of latches 114*c*, 114*g*, 114*k*, and 114*o*. In another example, the data of programmable resistive elements 106*b*, 106*f*, 106*j*, and 106*n* can be programmed into the column of latches 114*b*, 114*f*, 114*j*, and 114*n*. In a further example, the data of programmable resistive elements 106*b*, 106*f*, 106*j*, and 106*n* can be programmed into the column of latches 114*d*, 114*h*, 114*l*, and 114*p*.

In order to program data of a selected column of programmable resistive elements of RRAM memory array 202 into a selected column of latches of shift register array 204, a disable voltage input (e.g. low voltage or ground voltage, for example to disable LE line) is applied to LE lines of subsequent columns of latches after the selected column of latches in order to prevent inputs D of latches of the subsequent columns of latches from seeing voltages of outputs Q of latches of the selected column of latches. This prevents data stored at the latches of the subsequent columns from being changed or lost. Concurrent to the disable voltage input, an enable voltage input (e.g. high voltage or enable voltage, for example to enable LE line) is applied to LE lines of the selected column of latches and preceding columns of latches before the selected column of latches. This allows signals on the bit lines (BL) to propagate through the preceding columns of latches to the selected column of latches. Concurrent to the disable voltage input and the enable voltage input, a first voltage input (e.g. a high or read voltage) is provided on a select line (SL) associated with the selected column of programmable resistive elements (the other select lines are allowed to float), while the bit lines (BL) are left floating (e.g., no applied voltage), and a word line select voltage input (e.g. enable or high voltage) is applied to a word line (WL) associated with the selected column of programmable resistive elements (the other word lines are allowed to float). This activates the transistor elements associated with selected column of programmable resistive elements and conductively couples the second electrodes of the programmable resistive elements of the selected column of programmable resistive elements to their respective bit lines (BL), which allows the data of the programmable resistive elements of the selected column of programmable resistive elements to be seen at inputs D and transferred to outputs Q of latches of the selected column of latches. Then a disable voltage input (e.g. low voltage or ground voltage) is applied to the latch enable (LE) line associated with the selected column of latches in order to latch the data of the selected column of programmable resistive elements into the latches of the selected column of latches. In a non-limiting example, other enabled LE lines can remain active to program another column of latches with data from a column of programmable resistive elements. In another example, the other enabled LE lines can be disabled.

It is to be understood that during a programming of data of a programmable resistive element into a latch, the voltage state can be seen only by inputs D of latches conductively coupled directly or indirectly to a bitline (BL) (e.g., indirectly by way of one or more preceding latches whose latch enable lines are held high) that is coupled to a transistor element of the pair of the programmable resistive element and the transistor element.

For a non-limiting example, to program the column of programmable resistive elements associated with select line SL3 104*d* into the column latches associated with latch enable line LE3 112*d*, latch enable lines LE0 112*a*, LE1 112*b*, LE2 112*c*, and LE3 112*d* are enable, a first voltage input (e.g. a high or read voltage) is provided on select line SL3 104*d* (select lines SL0 104*a*, SL1 104*b*, and SL2 104*c* are allowed to float), bit lines BL0 102*a*, BL1 102*b*, BL2 102*c*, and BL3 102*d* are left floating (e.g., no applied voltage), and a word line select voltage input (e.g. enable or high voltage) is a applied to a word line WL3 108*d* (word lines WL0 108*a*, WL1 108*b*, and WL2 108*c* are allowed to float). This activates transistor elements 110*d*, 110*h*, 110*l*, and 110*p* and conductively couples the second electrodes of programmable resistive elements 106*d*, 106*h*, 106*l*, and 106*p* to respective bit lines BL0 102*a*, BL1 102*b*, BL2 102*c*, and BL3 102*d*, allowing the data of programmable resistive elements 106*d*, 106*h*, 106*l*, and 106*p* to be seen at inputs D and transferred to outputs Q of latches of latches 114*d*, 114*h*, 114*l*, and 114*p*. Then a disable voltage input (e.g. low voltage or ground voltage) is applied to latch enable line LE3 112*d* in order to latch the data into latches 114*d*, 114*h*, 114*l*, and 114*p*.

In an additional non-limiting example, to program the column of programmable resistive elements associated with select line SL2 104*c* into the column latches associated with latch enable line LE2 112*c*, latch enable line LE3 112*d* are disabled, latch enable lines LE0 112*a*, LE1 112*b*, and LE2 112*c* are enabled, a first voltage input (e.g. a high or read voltage) is provided on select line SL2 104*c* (select lines SL0 104*a*, SL1 104*b*, and SL3 104*d* are allowed to float), bit lines BL0 102*a*, BL1 102*b*, BL2 102*c*, and BL3 102*d* are left floating (e.g., no applied voltage), and a word line select voltage input (e.g. enable or high voltage) is a applied to a word line WL2 108*c* (word lines WL0 108*a*, WL1 108*b*, and WL3 108*d* are allowed to float). This activates transistor elements 110*c*, 110*g*, 110*k*, and 110*o* and conductively couples the second electrodes of programmable resistive elements 106*c*, 106*g*, 106*k*, and 106*o* to respective bit lines BL0 102*a*, BL1 102*b*, BL2 102*c*, and BL3 102*d*, allowing data of programmable resistive elements 106*c*, 106*g*, 106*k*, and 106*o* to be seen at inputs D and transferred to outputs Q of latches of latches 114*c*, 114*g*, 114*k*, and 114*o*. Then a disable voltage input (e.g. low voltage or ground voltage) is applied to latch enable line LE2 112c in order to latch the data into latches 114c, 114g, 114k, and 114o.

In another non-limiting example, to program the column of programmable resistive elements associated with select line SL1 104b into the column latches associated with latch enable line LE1 112b, latch enable lines LE2 112c and LE3 112d are disabled, latch enable lines LE0 112a, and LE1 112b are enabled, a first voltage input (e.g. a high or read voltage) is provided on select line SL1 104b (select lines SL0 104a, SL2 104c, and SL3 104d are allowed to float), bit lines BL0 102a, BL1 102b, BL2 102c, and BL3 102d are left floating (e.g., no applied voltage), and a word line select voltage input (e.g. enable or high voltage) is a applied to a word line WL1 108b (word lines WL0 108a, WL2 108c, and WL3 108d are allowed to float). This activates transistor elements 110b, 110f, 110j, and 110n and conductively couple the second electrodes of programmable resistive elements 106b, 106f, 106j, and 106n to respective bit lines BL0 102a, BL1 102b, BL2 102c, and BL3 102d, allowing data of programmable resistive elements 106b, 106f, 106j, and 106n to be seen at inputs D and transferred to outputs Q of latches of latches 114b, 114f, 114j, and 114n. Then a disable voltage input (e.g. low voltage or ground voltage) is applied to latch enable line LE1 112b in order to latch the data into latches 114b, 114f, 114j, and 114n.

In a further non-limiting example, to program the column of programmable resistive elements associated with select line SL0 104a into the column latches associated with latch enable line LE0 112a, latch enable lines LE1 112b, LE2 112c, and LE3 112d are disabled, latch enable line LE0 112a are enabled, a first voltage input (e.g. a high or read voltage) is provided on select line SL0 104a (select lines SL1 104b, SL2 104c, and SL3 104d are allowed to float), bit lines BL0 102a, BL1 102b, BL2 102c, and BL3 102d are left floating (e.g., no applied voltage), and a word line select voltage input (e.g. enable or high voltage) is a applied to a word line WL0 108a (word lines WL1 108b, WL2 108c, and WL3 108d are allowed to float). This activates transistor elements 110a, 110e, 110i, and 110m and conductively couples the second electrodes of programmable resistive elements 106a, 106e, 106i, and 106m to respective bit lines BL0 102a, BL1 102b, BL2 102c, and BL3 102d, allowing the data of programmable resistive elements 106a, 106e, 106i, and 106m to be seen at inputs D and transferred to outputs Q of latches of latches 114a, 114e, 114i, and 114m. Then a disable voltage input (e.g. low voltage or ground voltage) is applied to latch enable line LE0 112a in order to latch the data into latches 114a, 114e, 114i, and 114m.

In a further non-limiting example, to program the column of programmable resistive elements associated with select line SL1 104b into the column latches associated with latch enable line LE2 112c, latch enable line LE3 112d is disabled, latch enable line LE0 112a, LE1 112b, and LE2 112c are enabled, a first voltage input (e.g. a high or read voltage) is provided on select line SL1 104b (select lines SL0 104a, SL2 104c, and SL3 104d are allowed to float), bit lines BL0 102a, BL1 102b, BL2 102c, and BL3 102d are left floating (e.g., no applied voltage), and a word line select voltage input (e.g. enable or high voltage) is a applied to a word line WL1 108b (word lines WL0 108a, WL2 108c, and WL3 108d are allowed to float). This activates transistor elements 110b, 110f, 110j, and 110n and conductively couples the second electrodes of programmable resistive elements 106b, 106f, 106j, and 106n to respective bit lines BL0 102a, BL1 102b, BL2 102c, and BL3 102d, allowing the data of programmable resistive elements 106b, 106f, 106j, and 106n to be seen at inputs D and transferred to outputs Q of latches of latches 114c, 114g, 114k, and 114o. Then a disable voltage input (e.g. low voltage or ground voltage) is applied to latch enable line LE2 112c in order to latch the data into latches 114c, 114g, 114k, and 114o.

With the latches 114a . . . 114p having been latched to the respective voltage states and latch enable lines LE0, LE1, LE2, and LE3 disabled, the respective voltage states of latches 114a . . . 114p will drive associated gates of transistor elements 116a . . . 116p to conductively couple or decouple first and second terminals of transistor elements 116a . . . 116p according to the respective voltage states.

Figure 3:
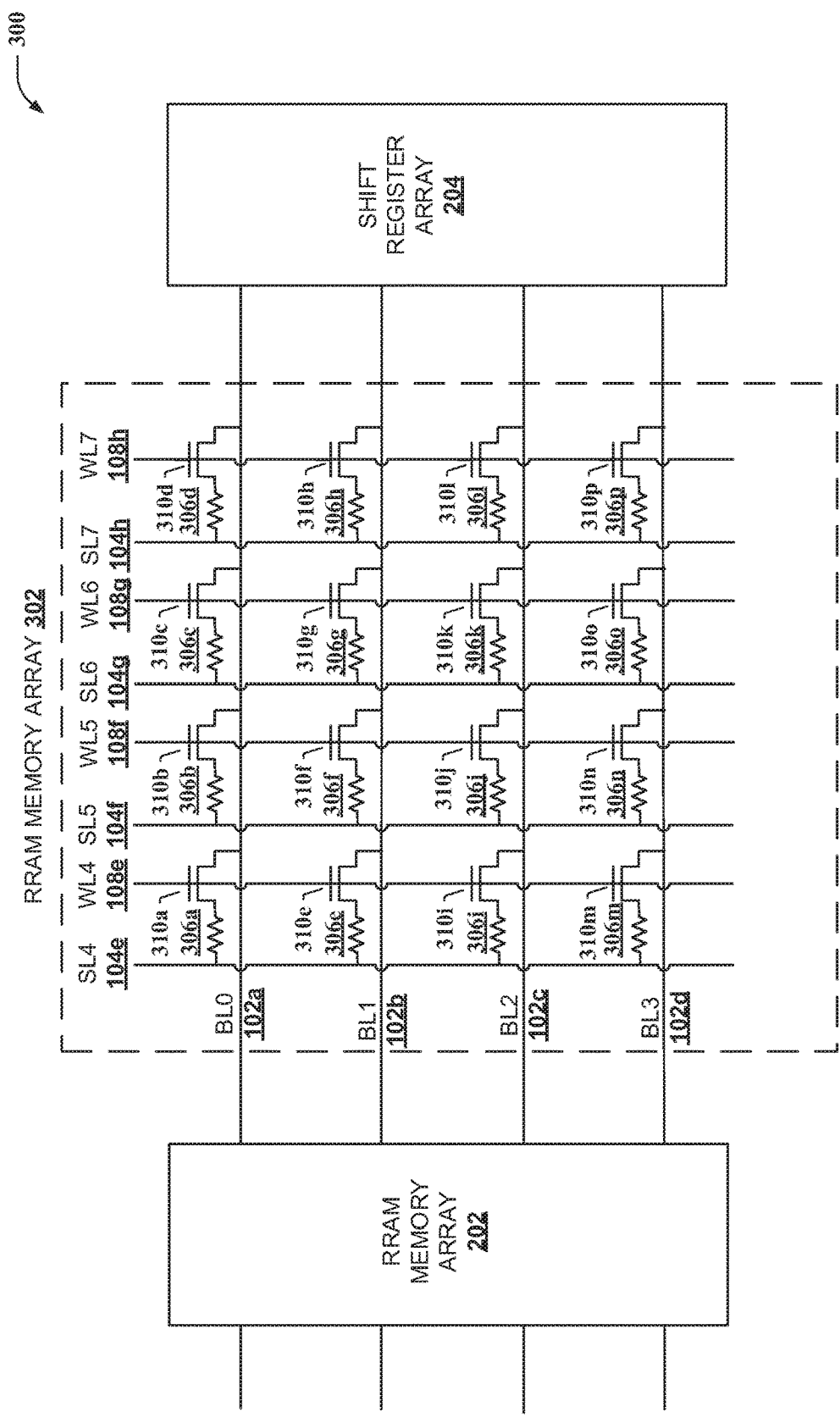
FIG. 3 illustrates a schematic diagram of a non-limiting example multi-buffered shift register input matrix using a two RRAM memory arrays according to one or more aspects of the subject disclosure.

FIG. 3 illustrates another non-limiting example schematic diagram of a multi-buffered shift register input matrix 300 for an FPGA. Multi-buffered shift register input matrix 300 is similar to buffered shift register input matrix 200 with the addition of a second RRAM memory array 202. Multi-buffered shift register input matrix 300 can comprise an RRAM memory array 202, an RRAM memory array 302, and a shift register array 204. RRAM memory array 302 is similar to RRAM memory array 202 and operates equivalently. Advantageously, incorporating RRAM memory array 302 into multi-buffered shift register input matrix 300 allows for a bit pattern stored in shift register array 204 to cause respective input/output junctions of an FPGA to be coupled or decoupled according to the bit pattern, while RRAM memory array 202 and/or RRAM memory array 302 is concurrently programmed with other bit patterns. The addition of RRAM memory array 302 allows for first bit pattern to be stored in RRAM memory array 202 and a second bit pattern to be stored in RRAM memory array 302, either of which can be programmed (e.g, written, moved, copied, or shifted) into shift register array 204 when desired. This can allow for switching between the first and second bit patterns as desired quickly and eliminates need for repeatedly re-programming the memory array. This is particularly important when FPGA is switching between the two operations constantly and furthermore when time in-between switching the operations is shorter than time required to reprogram the memory array. multi-buffered shift register input matrix 300 will further eliminate need for storage of the second bit pattern elsewhere.

Figure 4:
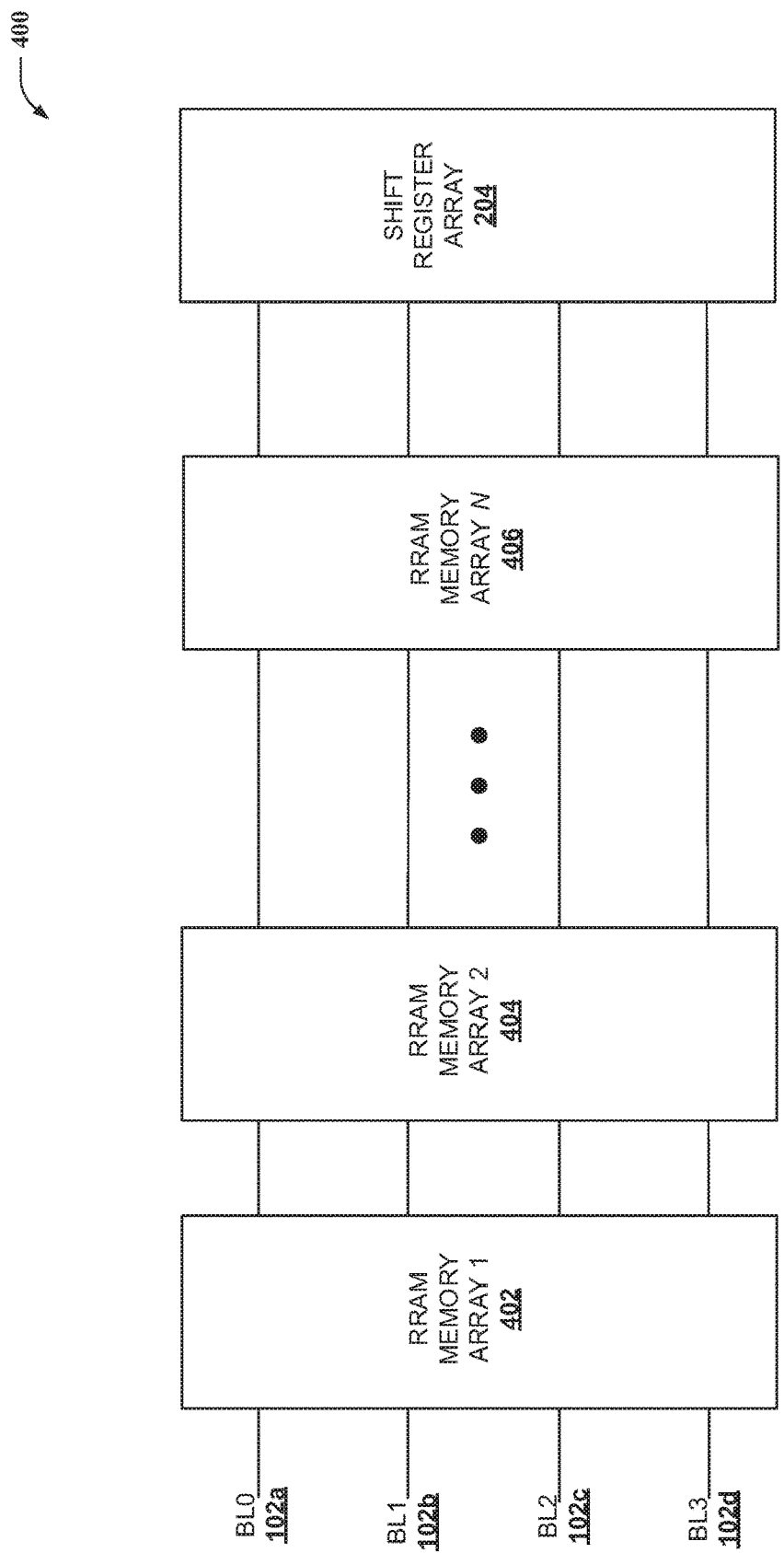
FIG. 4 illustrates a schematic diagram of a non-limiting example multi-buffered shift register input matrix using a plurality of RRAM memory arrays according to one or more aspects of the subject disclosure.

FIG. 4 illustrates another non-limiting example schematic diagram of a multi-buffered shift register input matrix 400 for an FPGA. Multi-buffered shift register input matrix 400 is similar to multi-buffered shift register input matrix 300 with the addition of a one or more RRAM memory arrays 202. Multi-buffered shift register input matrix 400 can comprise RRAM memory arrays 1 401, 2 404, . . . N 406, where N is any positive integer, and a shift register array 204. RRAM memory arrays 1 401, 2 404, . . . N 406 are similar to RRAM memory array 202 and operates equivalently. Advantageously, incorporating RRAM memory arrays 1 401, 2 404, . . . N 406 into multi-buffered shift register input matrix 400 allows for a bit pattern stored in shift register array 204 to cause respective input/output junctions of an FPGA to be coupled or decoupled according to the bit pattern, while RRAM memory arrays 1 401, 2 404, . . . and/or N 406 are concurrently programmed with other bit patterns. The addition of RRAM memory arrays 1 401, 2 404, . . . and/or N 406 allows for first bit pattern to be stored in RRAM memory array 1 402, a second bit pattern to be stored in RRAM memory array 2 404, and a Nth bit pattern to be stored in RRAM memory array N 404, any one of which can be programmed (e.g, written, moved, copied, or shifted) into shift register array 204 when desired. This can allow for switching between bit patterns 1 . . . N as desired quickly.

Figure 5:
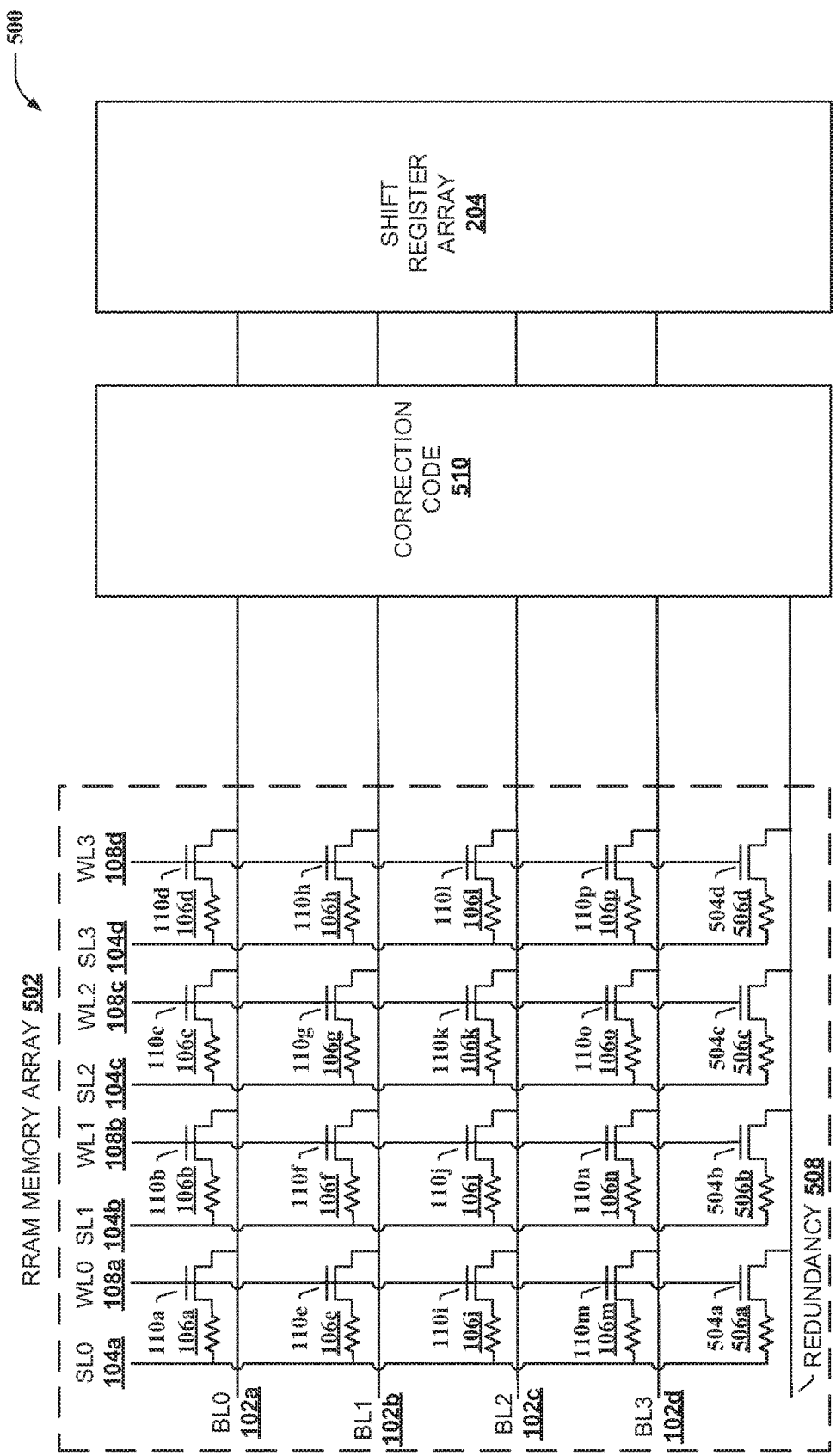
FIG. 5 illustrates a schematic diagram of a non-limiting example buffered shift register input matrix using a single RRAM memory array with correction code according to one or more aspects of the subject disclosure.

FIG. 5 illustrates another non-limiting example schematic diagram of a buffered shift register input matrix 500 for an FPGA. Buffered shift register input matrix 500 is similar to Buffered shift register input matrix 200 with the addition of an inline correction code component, an additional pair of programmable resistive element and transistor element for each column of pairs of programmable resistive elements and transistors. The programmable resistive element of the additional pair of programmable resistive element and transistor element stores a redundancy bit for a corresponding column of programmable resistive elements. The value (e.g. resistance state) of the bit (e.g. programmable resistive element) is determined according to an error correction algorithm, (e.g. error-correcting code (ECC), forward error correction (FCC), Hamming code, convolution codes, or any other suitable error correction algorithm). Buffered shift register input matrix 500 can comprise a RRAM memory array 502, a correction code component 510, and a shift register array 204. RRAM memory array 502 is similar to RRAM memory array 202 and operates equivalently. However, RRAM memory array 502 adds transistor elements 504a, 504b, 504c, and 504d are coupled to redundancy line 508 allowing a signal on redundancy line 508 to be applied concurrently at the second terminals of transistor elements 504a, 504b, 504c, and 504d. Transistor elements 504a, 504b, 504c, and 504d are respectively coupled to wordlines WL0 108a, WL108b, WL2 108c, and WL3 108d allowing respective signals on wordlines WL0 108a, WL108b, WL2 108c, and WL3 108d to be applied at the gates of transistor elements 504a, 504b, 504c, and 504d. Programmable resistive elements 506a, 506b, 506c, and 506d are respectively coupled to select lines SL0 104a, SL104b, SL2 104c, and SL3 104d allowing respective signals on select lines SL0 104a, SL104b, SL2 104c, and SL3 104d to be applied at the first electrodes of programmable resistive elements 506a, 506b, 506c, and 506d. Programmable resistive elements 506a, 506b, 506c, and 506d are programmed similarly to programmable resistive elements 106a . . . 106p using redundancy line 508 instead of a bit line (BL). When programming a bit pattern from RRAM memory array 502 to shift register array 204, voltage states (e.g. bits) representative of the resistance states of programmable resistive elements of a selected column of programmable resistive elements are read inline on bitlines BL0, 102a, BL1 102b, BL2 102c, and BL3 102d by correction code component 510 along with reading a voltage state (e.g. redundancy bit) on redundancy line 508 representative of a resistance state of programmable resistive element 506a, 506b, 506c, or 506d corresponding to the selected column of programmable resistive elements. Correction code component 510 can employ the bits and the redundancy bit along with an error correction algorithm employed to originally employed to generate the redundancy bit in order to determine if a bit (e.g. voltage state) is erroneous and correct the bit prior to programming the bit to shift register array 204. For example, when the voltage states respectively representative of resistance states of programmable resistive elements 106a, 106e, 106i, and 106m are shifted to correction code component 510, a voltage state representative of the resistance state of programmable resistive element 506a is concurrently shifted to correction code component 510. Advantageously, this allows for correcting for a programmable resistive element that is not being programmed to a correct resistance state, or correcting a voltage state that is changing as it is being shifted to the correction code component 510.

Figure 6:
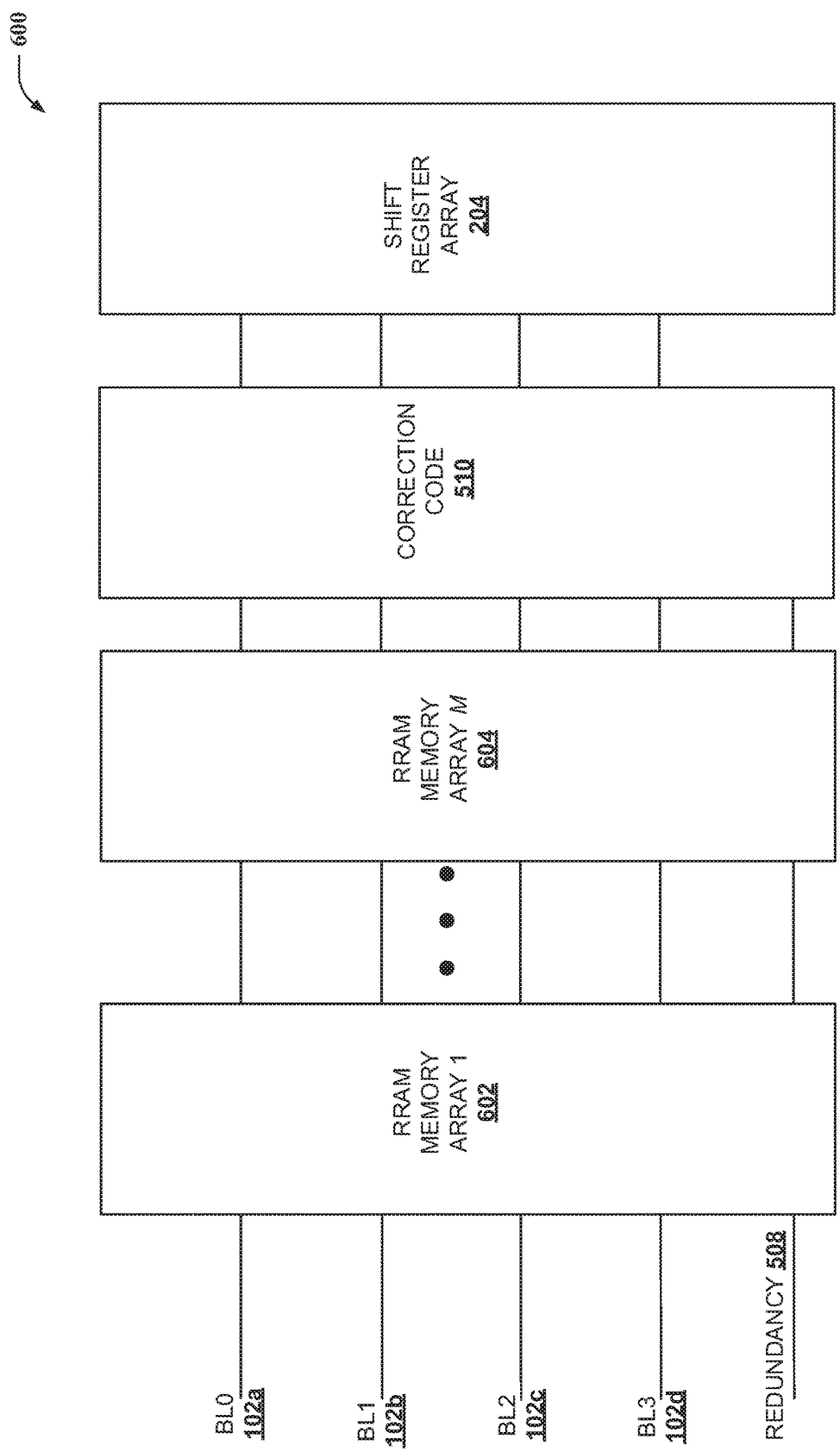
FIG. 6 illustrates a schematic diagram of a non-limiting example multi-buffered shift register input matrix using a plurality of RRAM memory arrays with correction code according to one or more aspects of the subject disclosure.

FIG. 6 illustrates another non-limiting example schematic diagram of a multi-buffered shift register input matrix 600 for an FPGA. Multi-buffered shift register input matrix 600 is similar to buffered shift register input matrix 500 with one or more additional RRAM memory arrays 502. Multi-buffered shift register input matrix 600 can comprise a RRAM memory arrays 1 602 . . . M 604, where M is any positive integer, a correction code component 510, and a shift register array 204. RRAM memory arrays 1 602 . . . M 604 are similar to RRAM memory array 502 and operate equivalently. Advantageously, incorporating RRAM memory arrays 1 602 . . . M 604 into multi-buffered shift register input matrix 600 allows for a bit pattern stored in shift register array 204 to cause respective input/output junctions of an FPGA to be coupled or decoupled according to the bit pattern, while RRAM memory arrays 1 602 . . . and/or M 604 are concurrently programmed with other bit patterns. The addition of RRAM memory arrays 1 602 . . . M 604 allows for first bit pattern to be stored in RRAM memory array 1 602 and a Mth bit pattern to be stored in RRAM memory array M 604, any one of which can be programmed (e.g., written, moved, copied, or shifted) into shift register array 204 when desired. This can allow for switching between bit patterns 1 . . . M as desired quickly.

Figure 7:
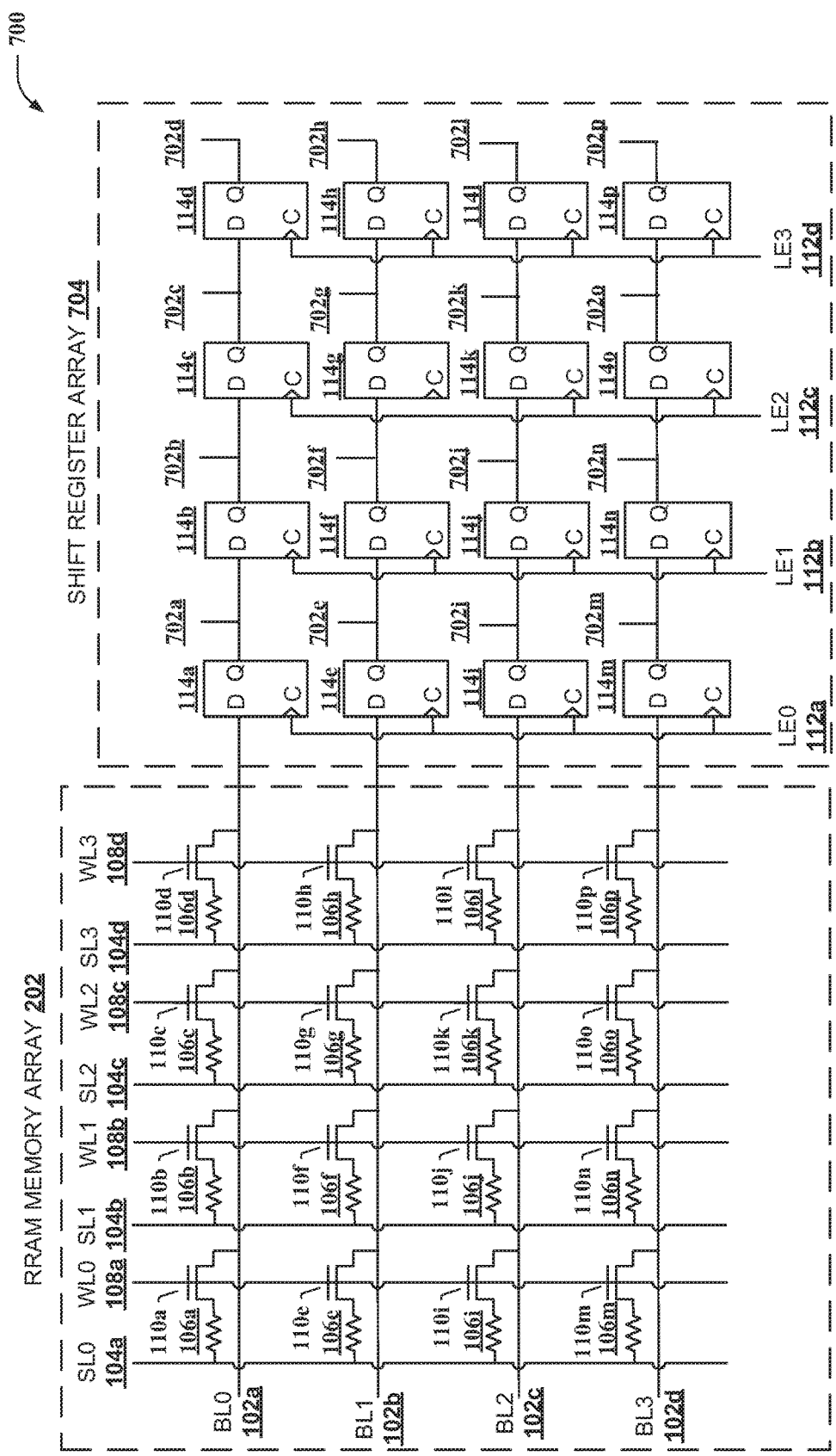
FIG. 7 illustrates a schematic diagram of a non-limiting example buffered shift register input matrix using a single RRAM memory array according to one or more aspects of the subject disclosure.

FIG. 7 illustrates another non-limiting example schematic diagram of a buffered shift register input matrix 700 for configuration bits, to trim analog circuitry, or any other suitable purpose. The outputs of the latches or shift registers can be used as inputs to configure a device or controller for example for trim setting, configuration, or any other suitable purpose. Advantageously, programming the information (e.g. bits) in the RRAM memory is fast and non-volatile which allow for faster power up of the device or controller. Buffered shift register input matrix 700 can comprise a RRAM memory array 202 and a shift register array 704. Shift register array 704 is similar to shift register array 204 and operate equivalently. However, shift register array 704 differs from shift register array 204 in that transistor elements 116a . . . 116p are remove and replace by lines 702a . . . 702p which can be couple to any suitable inputs to drive the voltage states stored in the corresponding latches 114a . . . 114p through outputs Q to lines 702a . . . 702p.

In the above disclosed embodiments, the latches 114a . . . 114p between before the lines 702a . . . 702p isolate the respective lines 702a . . . 702p from the programmable resistive elements of RRAM memory arrays 202, 302, 402, 404, 406, 502, 602, 604, and correction code component 510 to isolate leakage current that may cause a disturbance on lines 702a . . . 702p.

The aforementioned diagrams have been described with respect to interaction between several components, or memory architectures. It should be appreciated that such diagrams can include those components and architectures specified therein, some of the specified components/architectures, and/or additional components/architectures. For example, a memory cell architecture could include a combination of programmable resistive element 106, transistor element 110, latch 114, in conjunction with transistor element 116, signal input 118 and signal output 120. Sub-components could also be implemented as electrically connected to other sub-components rather than included within a parent architecture. Additionally, it should be noted that one or more disclosed processes could be combined into a single process providing aggregate functionality. For instance, a program process can comprise an erase process, or vice versa, to facilitate programming and erasing a semiconductor cell by way of a single process. In addition, it should be appreciated that respective rows of disclosed switching blocks can be programmed or erased in groups (e.g., multiple rows programmed or erased concurrently) or individually. Components of the disclosed architectures can also interact with one or more other components not specifically described herein but known by those of skill in the art.

In view of the exemplary diagrams described supra, process methods that can be implemented in accordance with the disclosed subject matter will be better appreciated with reference to the flow charts of FIGS. 8-14. While for purposes of simplicity of explanation, the methods 800, 900, 1000, 1100, 1200, 1300, and 1400 are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods 800, 900, 1000, 1100, 1200, 1300, and 1400 described hereinafter. Additionally, it should be further appreciated that the methods 800, 900, 1000, 1100, 1200, 1300, and 1400 disclosed hereinafter and throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Figure 8:
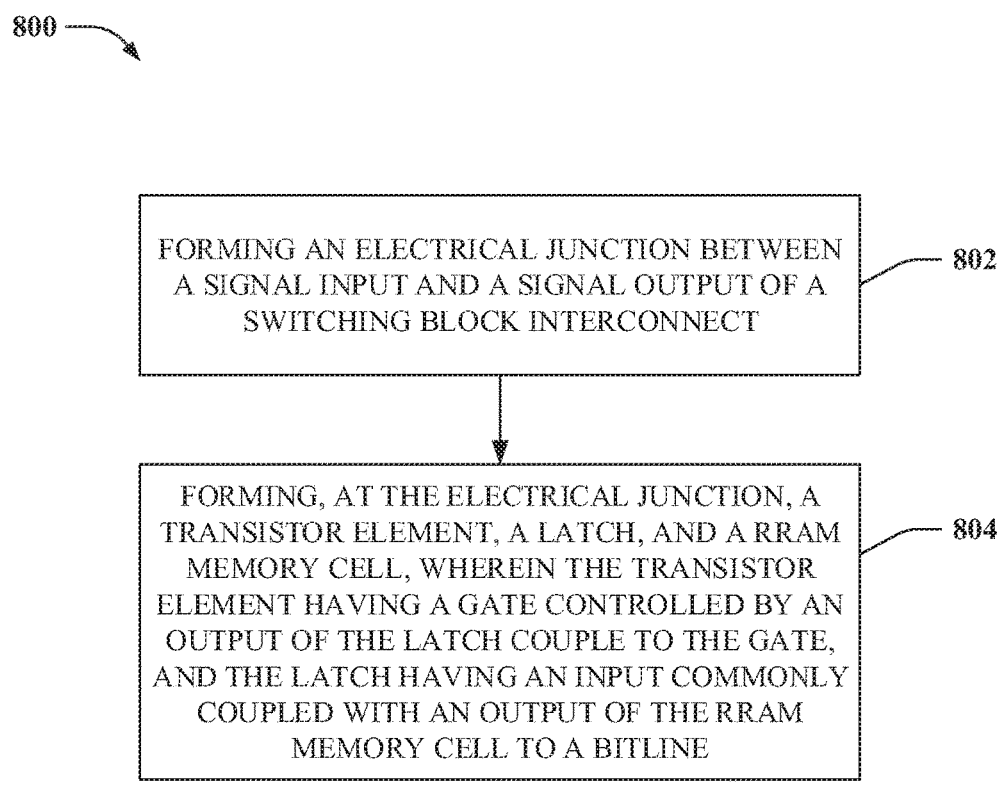
FIG. 8 depicts a flowchart of an example method for fabricating a field programmable gate array (FPGA) utilizing RRAM technology according to some aspects.

FIG. 8 illustrates a flowchart of an example method 800 for fabricating a programmable switching block, according to aspects of the subject disclosure. At 802, method 800 can comprise forming an electrical junction between a signal input and a signal output of the programmable switching block. At 804, method 800 can comprise forming, at the electrical junction, a transistor element, a latch, and a RRAM memory cell, wherein the transistor element having a gate controlled by an output of the latch coupled to the gate, and the latch having an input commonly coupled with an output of the RRAM memory cell to a bitline.

Figure 9:
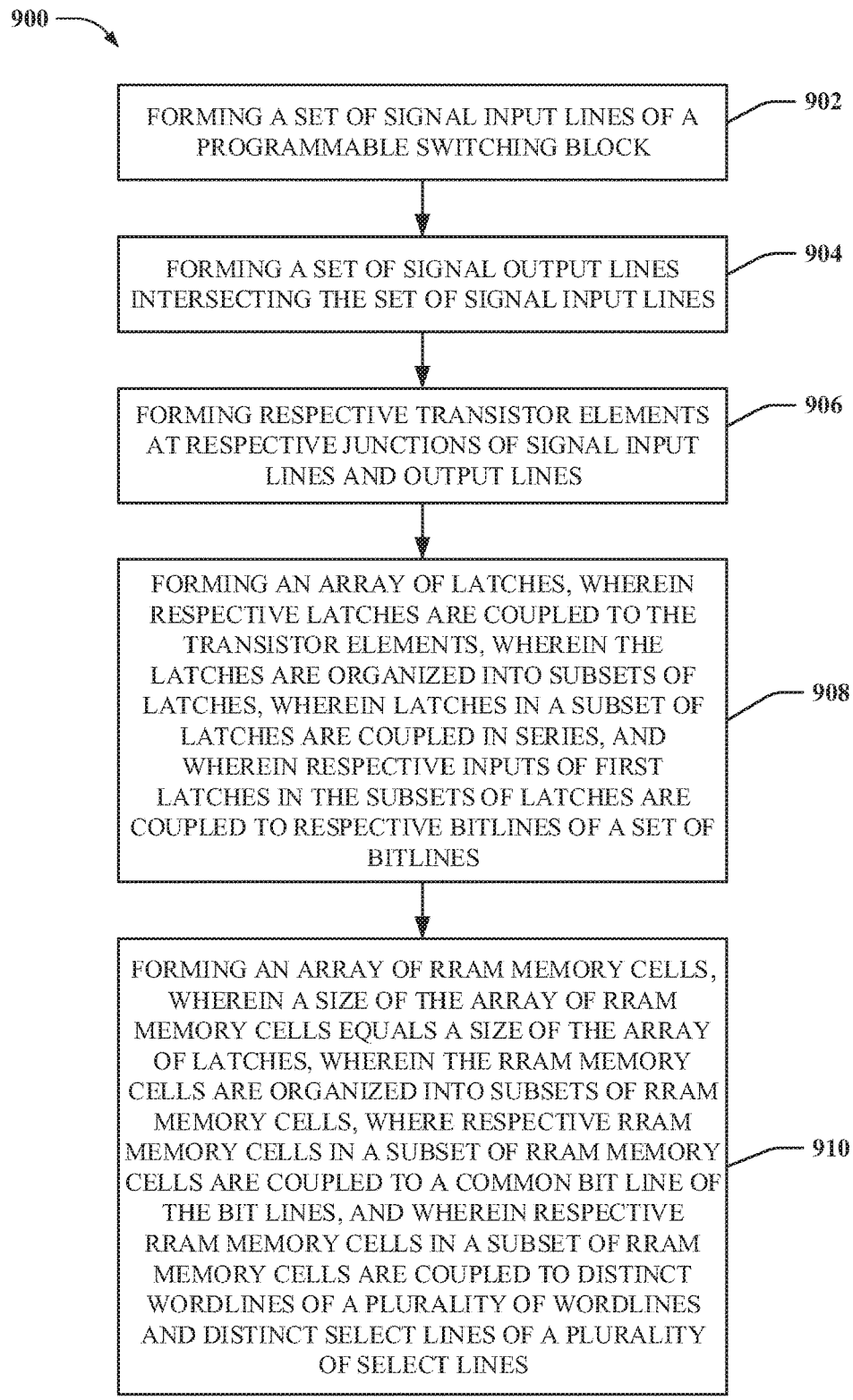
FIG. 9 depicts a flowchart of an example method for fabricating a field programmable gate array (FPGA) utilizing RRAM technology according to some aspects.

FIG. 9 illustrates a flowchart of an example method 900 for fabricating a programmable switching block, according to aspects of the subject disclosure. At 902, method 900 can comprise forming a set of signal input lines of a programmable switching block. At 904, method 900 can comprise forming a set of signal output lines intersecting the set of signal input lines. At 906, method 900 can comprise forming respective transistor elements at respective junctions of signal input lines and output lines. The respective transistor elements are formed to electrically connect or electrically disconnect an input line from an output line in response to an input at a control gate of the transistor element. At 908, method 900 can comprise forming an array of latches and coupling output terminals of respective latches to control gates of the respective transistor elements, wherein the latches are organized into an array in which subsets of the latches are formed along rows of the array, one subset of latches per row of the array, and wherein latches in a subset of latches are coupled in series, and wherein respective inputs of first latches in the subsets of latches are coupled to respective bitlines of a set of bitlines (e.g., see FIG. 2, supra, latches 114a, 114b, 114c, 114d forming a subset along a top row of the array comprising latches 114a-114p, and having BL0 102a being input to first latch 114a of the top row of latches). A bitline can therefore serve as an input to a subset of latches (along a row) and specifically an input to a first latch in the series of latches that form the subset. An output of a latch in the series is coupled, in addition to a control gate of one of the transistor elements, to an input of a subsequent latch in the series (e.g., see FIG. 2, supra, an output at terminal Q of latch 114a connected to a control gate of transistor 116a and an input terminal D of latch 114b). Respective outputs of the latches therefore provide inputs to the transistor control gates to control the transistor elements, as well as inputs to the next subsequent latch in the series. At 910, method 900 can comprise forming an array of RRAM memory cells, wherein a size of the array of RRAM memory cells equals a size of the array of latches, wherein the RRAM memory cells are organized into subsets of RRAM memory cells, where respective RRAM memory cells in a subset of RRAM memory cells are coupled to a common bit line of the bit lines, and wherein respective RRAM memory cells in a subset of RRAM memory cells are coupled to distinct wordlines of a plurality of wordlines and distinct select lines of a plurality of select lines. A common bitline serves as an input from a subset of RRAM memory cells to a subset of latches.

Figure 10:
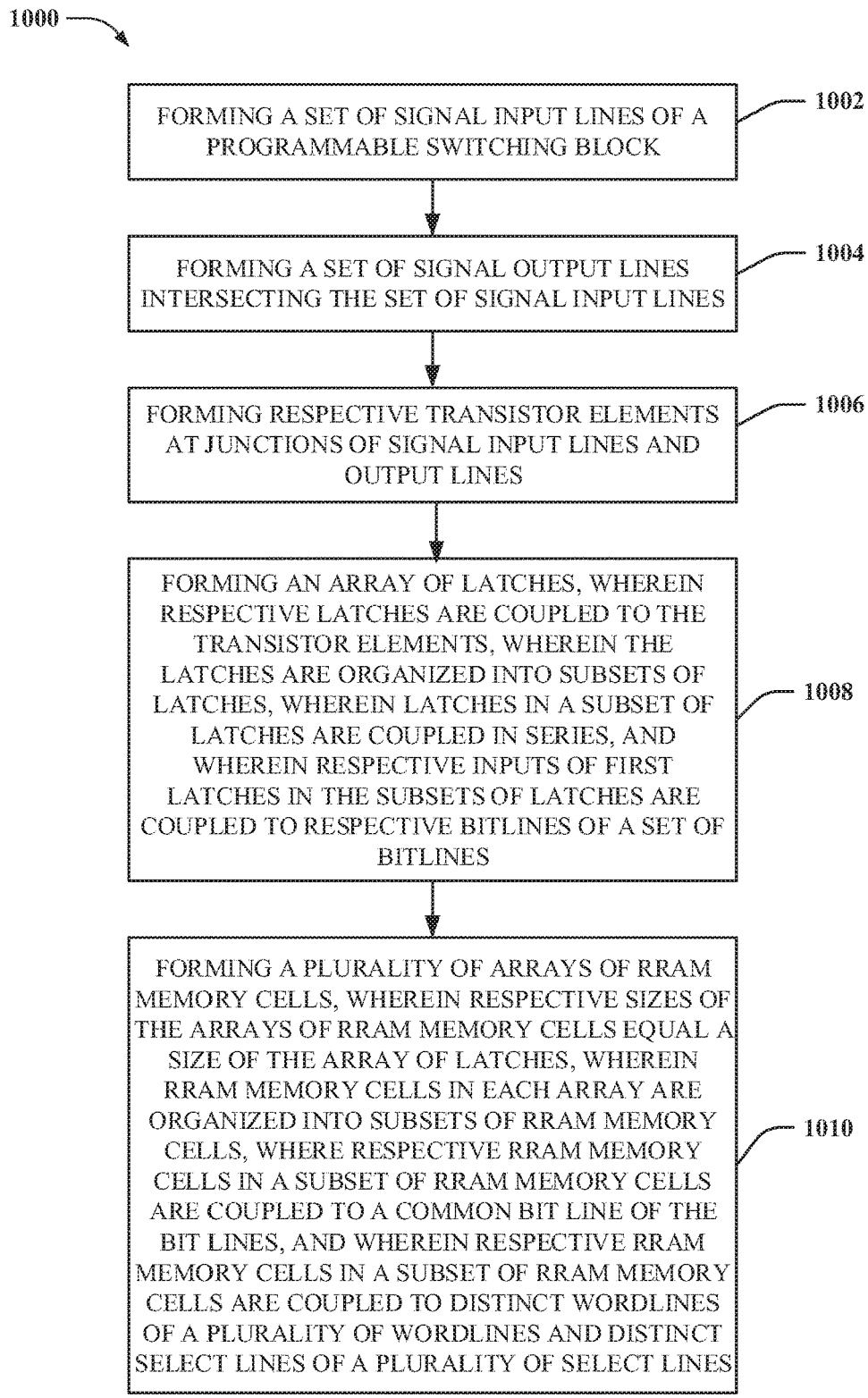
FIG. 10 depicts a flowchart of an example method for fabricating a field programmable gate array (FPGA) utilizing RRAM technology according to some aspects.

FIG. 10 illustrates a flowchart of an example method 1000 for fabricating a programmable switching block, according to aspects of the subject disclosure. At 1002, method 1000 can comprise forming a set of signal input lines of a programmable switching block. At 1004, method 1000 can comprise forming a set of signal output lines intersecting the set of signal input lines. At 1006, method 1000 can comprise forming respective transistor elements at respective junctions of signal input lines and output lines. The respective transistor elements are formed to electrically connect or electrically disconnect an input line from an output line in response to an input at a control gate of the transistor element. At 1008, method 1000 can comprise forming an array of latches, wherein respective latches have output terminals coupled to control gates of the respective transistor elements, wherein the latches are formed into an array in which a row of latches coupled in series from output terminal to input terminal of the array is defined as a separate subset of latches in the array. Respective inputs of the first latches in each row or subset of latches are coupled to respective bitlines of a set of bitlines. An output of a latch in a given row is coupled to an input of a subsequent latch in the row, in addition to a gate of one of the transistor elements, and provides an input to both the control gate of the one transistor element as well as the input terminal to the subsequent latch in the row. At 1010, method 1000 can comprise forming a plurality of arrays of RRAM memory cells, wherein respective sizes of the arrays of RRAM memory cells equal a size of the array of latches, wherein RRAM memory cells in each array are organized into subsets of RRAM memory cells, where respective RRAM memory cells in a subset of RRAM memory cells are coupled to a common bit line of the bit lines, and wherein respective RRAM memory cells in a subset of RRAM memory cells are coupled to distinct wordlines of a plurality of wordlines and distinct select lines of a plurality of select lines. A common bitline serves as an input from a subset of RRAM memory cells to a subset of latches, where individual RRAM memory cells on a common bitline are individually activated by one of the distinct wordlines and one of the distinct select lines to provide a single output on the common bitline for a given clock cycle (or clock cycles, e.g., see FIG. 13, infra, clock source(s) 1308).

Figure 11:
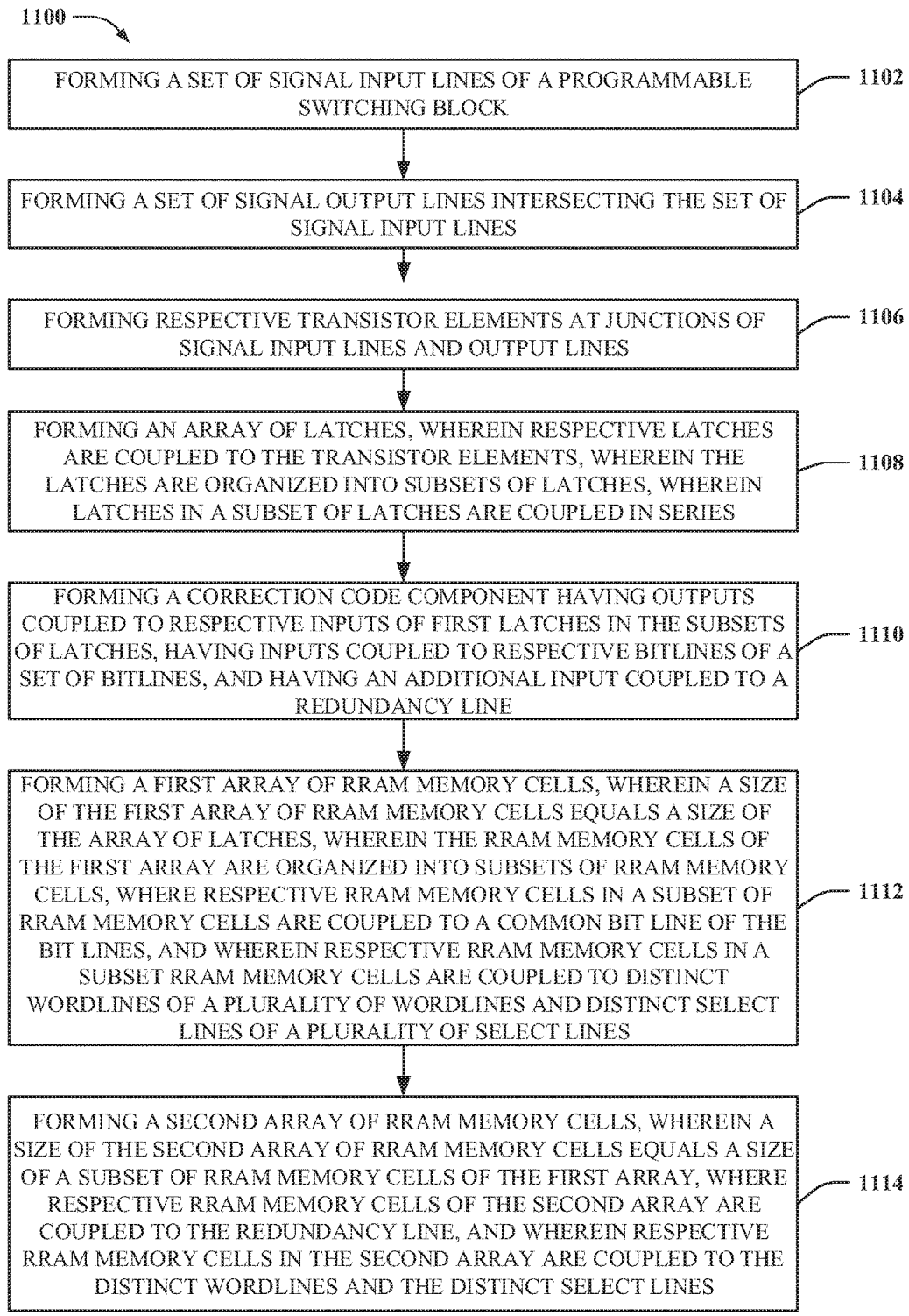
FIG. 11 depicts a flowchart of an example method for fabricating a field programmable gate array (FPGA) utilizing RRAM technology according to some aspects.

FIG. 11 illustrates a flowchart of an example method 1100 for fabricating a programmable switching block, according to aspects of the subject disclosure. At 1102, method 1100 can comprise forming a set of signal input lines of a programmable switching block. At 1104, method 1100 can comprise forming a set of signal output lines intersecting the set of signal input lines. At 1106, method 1100 can comprise forming respective transistor elements at respective junctions of signal input lines and output lines. The respective transistor elements are formed to electrically connect or electrically disconnect an input line from an output line in response to an input at a control gate of the transistor element. At 1108, method 1100 can comprise forming an array of latches, wherein respective latches are coupled to the transistor elements, wherein the latches are organized into subsets of latches (e.g., a subset consisting of a row of latches in an array of the latches). In various embodiments, latches in a subset of latches are coupled in series such that an output of a latch in the series is coupled to an input of a subsequent latch in the series. Respective outputs of the latches are also coupled to gates of the transistor elements and provide inputs to the gates to control the transistor elements, as well as inputs to subsequent latches in a given series of latches. At 1110, method 1100 can comprise forming a correction code component having outputs coupled to respective inputs of first latches in the subsets of latches, having inputs coupled to respective bitlines of a set of bitlines, and having an additional input coupled to a redundancy line. At 1112, method 1100 can comprise forming a first array of RRAM memory cells, wherein a size of the first array of RRAM memory cells equals a size of the array of latches, wherein the RRAM memory cells of the first array are organized into subsets of RRAM memory cells, where respective RRAM memory cells in a subset of RRAM memory cells are coupled to a common bit line of the bit lines, and wherein respective RRAM memory cells in a subset RRAM memory cells are coupled to distinct wordlines of a plurality of wordlines and distinct select lines of a plurality of select lines. A common bitline serves as an input from a subset of RRAM memory cells to a subset of latches, where individual RRAM memory cells of a given subset can provide a single output on the common bitline by activation of an associated wordline and an associated source line. At 1114, method 1100 can comprise forming a second array of RRAM memory cells, wherein a size of the second array of RRAM memory cells equals a size of a subset of RRAM memory cells of the first array, where respective RRAM memory cells of the second array are coupled to the redundancy line, and wherein respective RRAM memory cells in the second array are coupled to the distinct wordlines and the distinct select lines.

Figure 12:
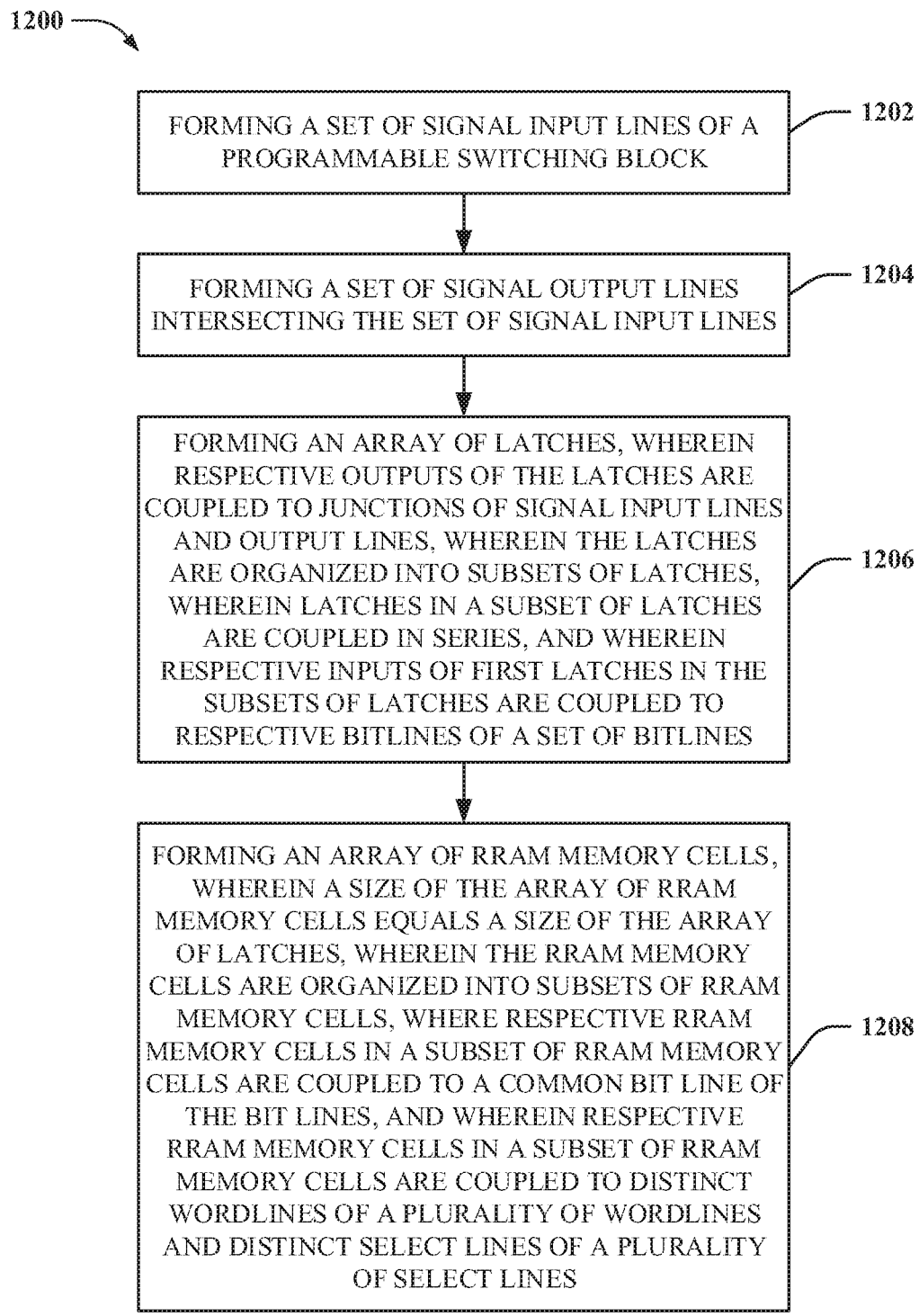
FIG. 12 depicts a flowchart of an example method for fabricating a field programmable gate array (FPGA) utilizing RRAM technology according to some aspects.

FIG. 12 illustrates a flowchart of an example method 1200 for fabricating a programmable switching block, according to aspects of the subject disclosure. At 1202, method 1200 can comprise forming a set of signal input lines of a programmable switching block. At 1204, method 1200 can comprise forming a set of signal output lines intersecting the set of signal input lines. At 1206, method 1200 can comprise forming an array of latches, wherein respective outputs of the latches are coupled to junctions of signal input lines and output lines, wherein the latches are organized into subsets of latches, wherein latches in a subset of latches are coupled in series from an output of a prior latch in the series to an input of a subsequent latch in the series. Further, respective inputs of first latches in the subsets of latches are coupled to respective bitlines of a set of bitlines. At 1208, method 1200 can comprise forming an array of RRAM memory cells, wherein a size of the array of RRAM memory cells equals a size of the array of latches, wherein the RRAM memory cells are organized into subsets of RRAM memory cells, where respective RRAM memory cells in a subset of RRAM memory cells are coupled to a common bit line of the bit lines, and wherein respective RRAM memory cells in a subset of RRAM memory cells are coupled to distinct wordlines of a plurality of wordlines and distinct select lines of a plurality of select lines. A common bitline serves as an input from a subset of RRAM memory cells to a subset of latches, where individual RRAM memory cells of a given subset can provide a single output on the common bitline by activation of an associated wordline and an associated source line.

Figure 13:
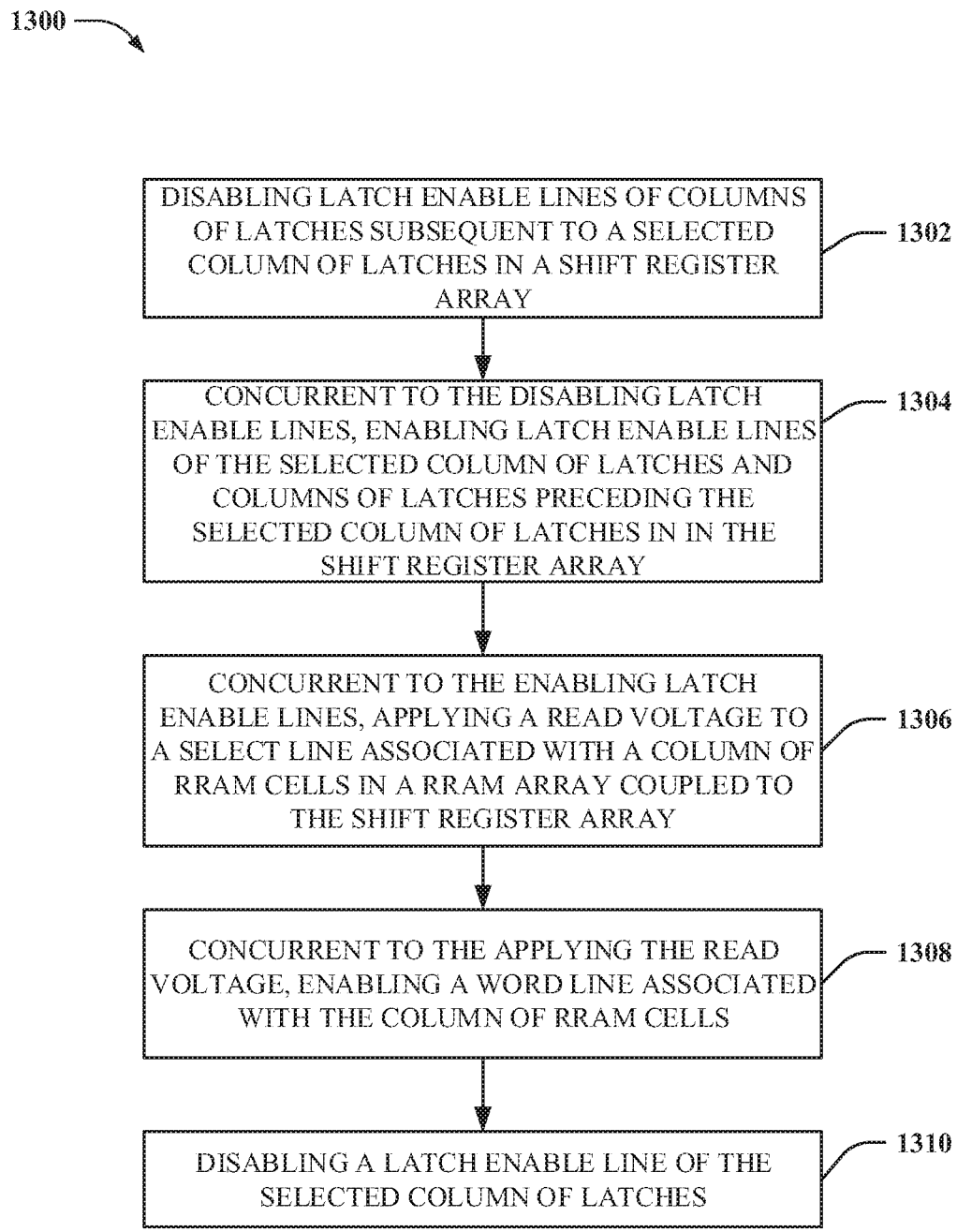
FIG. 13 depicts a flowchart of an example method for programming a programmable switching block utilizing RRAM technology according to some aspects.

FIG. 13 illustrates a flowchart of an example method 1300 for programming a programmable switching block, according to aspects of the subject disclosure. At 1302, method 1300 can comprise disabling latch enable lines of columns of latches subsequent to a selected column of latches (subsequent referring, e.g., to latches connected directly or indirectly to output nodes of the selected column of latches) in a shift register array (e.g. via command interface component 1514 or state machine 1516). At 1304, method 1300 can comprise concurrent to the disabling latch enable lines, enabling latch enable lines of the selected column of latches and columns of latches preceding the selected column of latches (preceding referring, e.g., to latches connected directly or indirectly to input nodes of the selected column of latches) in the shift register array (e.g. via command interface component 1514 or state machine 1516). At 1306, method 1300 can comprise concurrent to the enabling latch enable lines, applying a read voltage to a select line associated with a column of RRAM cells in a RRAM array coupled to the shift register array (e.g. via command interface component 1514 or state machine 1516). At 1308, method 1300 can comprise concurrent to the applying the read voltage, enabling a word line associated with the column of RRAM cells (e.g. via command interface component 1514 or state machine 1516). At 1310, method 1300 can comprise disabling a latch enable line of the selected column of latches (e.g. via command interface component 1514 or state machine 1516).

Figure 14:
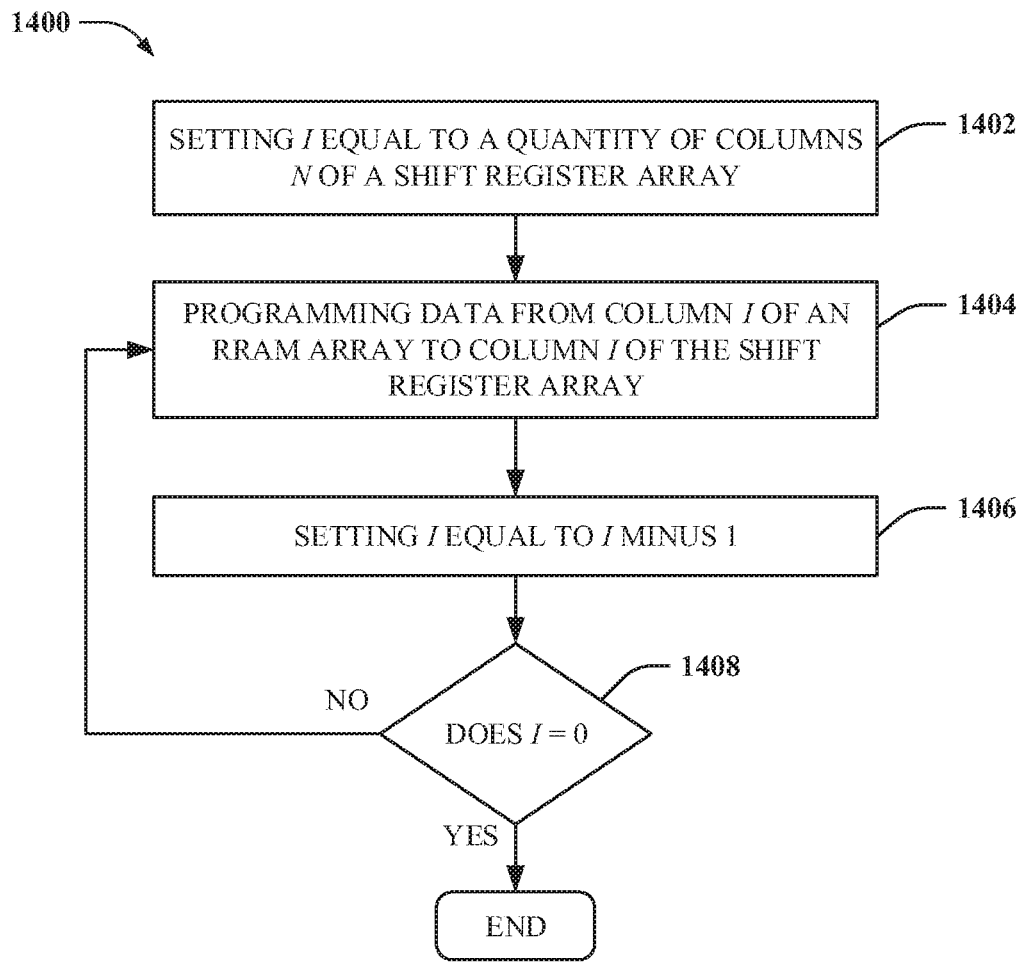
FIG. 14 depicts a flowchart of an example method for programming a programmable switching block utilizing RRAM technology according to some aspects.

FIG. 14 illustrates a flowchart of an example method 1400 for programming a programmable switching block, according to aspects of the subject disclosure. At 1402, method 1400 can comprise setting I equal to a quantity of columns N of a shift register array (e.g. via command interface component 1514 or state machine 1516). At 1404, method 1400 can comprise programming data from column I of an RRAM array to column I of the shift register array (e.g. via command interface component 1514 or state machine 1516). At 1406, method 1400 can comprise setting I=I−1. (e.g. via command interface component 1514 or state machine 1516). At 1408, method 1400 can determine whether I=0. (e.g. via command interface component 1514 or state machine 1516). If the determination at 1406 is "NO", meaning I does not equal 0, method 1400 proceeds to 1404. If the determination at 1406 is "YES", meaning I does equal 0, method 1400 ends.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the appended claims. Furthermore, to the extent that the term "includes" "has" or "having" are used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

Figure 15:
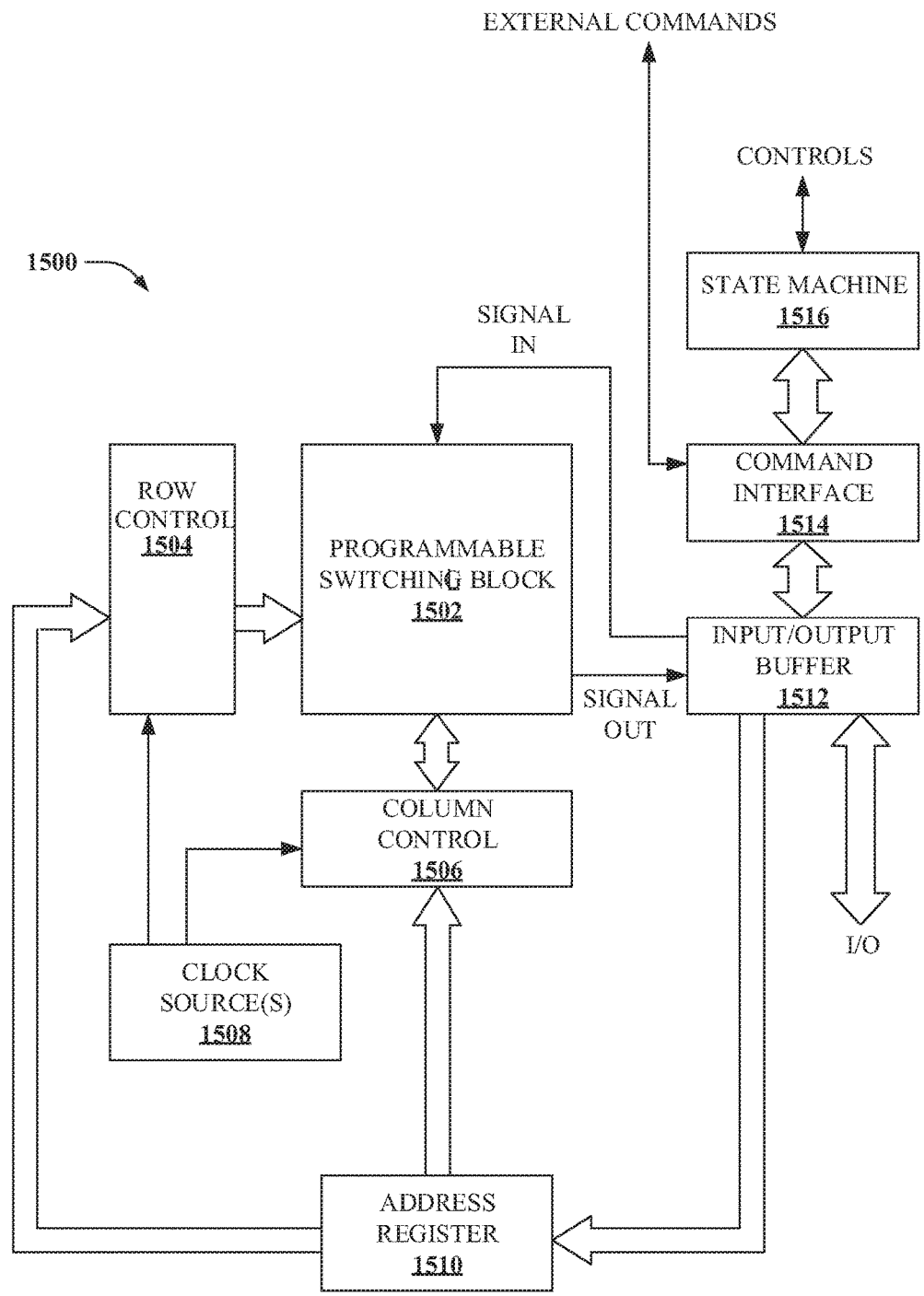
FIG. 15 depicts a block diagram of an example electronic operating environment according to one or more aspects of the subject disclosure.

In order to provide a context for the various aspects of the disclosed subject matter, FIG. 15, as well as the following discussion, is intended to provide a brief, general description of a suitable environment in which various aspects of the disclosed subject matter can be implemented or processed. While the subject matter has been described above in the general context of semiconductor architectures and process methodologies for fabricating and operating such architectures, those skilled in the art will recognize that the subject innovation also can be implemented in combination with other architectures or process methodologies. Moreover, those skilled in the art will appreciate that the disclosed processes can be practiced with a processing system or a computer processor, either alone or in conjunction with a host computer, which can include single-processor or multiprocessor computer systems, mini-computing devices, mainframe computers, as well as personal computers, handheld computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory, or the like. In a distributed computing environment, program modules may be located in both local and remote memory storage modules or devices.

FIG. 15 illustrates a block diagram of an example operating and control environment 1500 for a programmable switching block 1502 according to aspects of the subject disclosure. In at least one aspect of the subject disclosure, programmable switching block 1502 can comprise RRAM memory cell technology. Respective RRAM memory cells can be employed for programming respective input and output signal junctions of programmable switching block 1502, as described herein.

A column controller 1506 can be formed adjacent to programmable switching block 1506. Moreover, column controller 1506 can be electrically coupled with bit lines of programmable switching block 1502. Column controller 1506 can control respective bitlines, applying suitable program, erase or read voltages to selected bitlines.

In addition, operating and control environment 1500 can comprise a row controller 1504. Row controller 1504 can be formed adjacent to programmable switching block 1506, and electrically connected with word lines of programmable switching block 1502. Row controller 1504 can select particular rows of memory cells with a suitable selection voltage. Moreover, row controller 1504 can facilitate program, erase or read operations by applying suitable voltages at selected word lines.

A clock source(s) 1508 can provide respective clock pulses to facilitate timing for read, write, and program operations of row control 1504 and column control 1506. Clock source(s) 1508 can further facilitate selection of word lines or bit lines in response to external or internal commands received by operating and control environment 1500. An input/output buffer 1512 can be connected to an external host apparatus, such as a computer or other processing device (not depicted) by way of an I/O buffer or other I/O communication interface. Input/output buffer 1512 can be configured to receive write data, receive an erase instruction, output readout data, and receive address data and command data, as well as address data for respective instructions. Address data can be transferred to row controller 1504 and column controller 1506 by an address register 1510. In addition, input data is transmitted to programmable switching block 1502 via signal input lines, and output data is received from programmable switching block 1502 via signal output lines. Input data can be received from the host apparatus, and output data can be delivered to the host apparatus via the I/O buffer.

Commands received from the host apparatus can be provided to a command interface 1514. Command interface 1514 can be configured to receive external control signals from the host apparatus, and determine whether data input to the input/output buffer 1512 is write data, a command, or an address. Input commands can be transferred to a state machine 1516.

State machine 1516 can be configured to manage programming and reprogramming of programmable switching block 1502. State machine 1516 receives commands from the host apparatus via input/output interface 1512 and command interface 1514, and manages read, write, erase, data input, data output, and like functionality associated with programmable switching block 1502. In some aspects, state machine 1516 can send and receive acknowledgments and negative acknowledgments regarding successful receipt or execution of various commands.

To implement read, write, erase, input, output, etc., functionality, state machine 1516 can control clock source(s) 1508. Control of clock source(s) 1508 can cause output pulses configured to facilitate row controller 1504 and column controller 1506 implementing the particular functionality. Output pulses can be transferred to selected bit lines by column controller 1506, for instance, or word lines by row controller 1504, for instance.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments include a system as well as a computer-readable medium having computer-executable instructions for performing the acts and/or events of the various processes.

In addition, while a particular feature may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

What is claimed is:

1. A field programmable gate array (FPGA), comprising:
  a switching block routing array comprising a plurality of signal inputs including a first signal input, a plurality of signal outputs including a first signal output, and a shift register array having a plurality of latches including a first latch and a second latch and a first plurality of transistor elements including a first transistor element, wherein each latch comprises an input, an output, and a latch enable input, wherein each transistor element includes a first terminal, a second terminal, and a control, wherein an output of the first latch is coupled to an input of the second latch and to a control of the first transistor element, wherein the first signal input is coupled to a first terminal of the first transistor element, wherein the first signal output is coupled to a second terminal of the first transistor element; and
  a resistive random access memory (RRAM) array comprising a plurality of programmable resistive elements including a first programmable resistive element and a second programmable resistive element and a second plurality of transistor elements including a second transistor element and a third transistor element, wherein each programmable resistive element includes a first terminal and a second terminal, wherein each transistor element of the second plurality of transistor elements includes a first terminal, a second terminal, and a control, wherein the second terminal of the first programmable resistive element is coupled to the first terminal of the second transistor element, wherein the second terminal of the second programmable resistive element is coupled to the first terminal of the third transistor element, and wherein the second terminal of the second transistor element is coupled to the second terminal of the third transistor element, and to the input of the first latch.

2. The field programmable gate array (FPGA) of claim 1, wherein controls of the first plurality of transistor elements are configured to electrically couple or decouple the plurality of signal inputs and the plurality of signal outputs in response to control signals, wherein the plurality of latches comprise subsets of rows of latches, and the second plurality of transistor elements comprise rows of transistor elements, wherein latches in each row of latches are coupled in series to each other by the inputs and the outputs, each row of latches is associated with a distinct bit line, wherein each first latch in each row of latches is coupled to second terminals of transistor elements of a corresponding row of transistor elements and coupled to a corresponding bit line, wherein the latches comprise subsets of columns of latches, each column of latches is associated with a distinct latch enable line, wherein the latch enable inputs of latches in each column of latches are coupled to corresponding latch enable lines.

3. The field programmable gate array (FPGA) of claim 2, wherein a programmable resistive element is characterized by a plurality of resistive states including a low resistive state and a high resistive state, wherein the second plurality of transistor elements comprise subsets of columns of transistor elements, each column of latches is associated with a distinct word line, wherein the controls of the transistor elements in each column of transistor elements are coupled to each other and to a corresponding word line, wherein the plurality of programmable resistive elements comprise subsets of columns of programmable resistive elements, each column of programmable resistive elements is associated with a distinct select line and a distinct column of transistor elements, wherein the first terminals of programmable resistive elements in each column of programmable resistive elements are coupled to each other and a corresponding select line, each second terminal of a programmable resistive element in a column of programmable resistive elements is coupled to a first terminal of a distinct transistor element of an associated column of transistor elements.

4. The field programmable gate array (FPGA) of claim 3, wherein bit lines are selectively coupled to a first plurality of voltages, wherein select lines are selectively coupled to a second plurality of voltages, wherein word lines are selectively coupled to a third plurality of voltages, and wherein latch enable lines are selectively coupled to a fourth plurality of voltages.

5. The field programmable gate array (FPGA) of claim 4, further comprising:
  a command component configured to program a programmable resistive element of the programmable resistive elements comprising:
    disable voltage input to the latch enable lines;
    apply a first input voltage to a select line coupled to the programmable resistive element;
    apply a ground voltage to other select lines;

apply a second input voltage to a bit line coupled to a second transistor element that is paired with the programmable resistive element, wherein a difference between the first input voltage and the second input voltage meets a program voltage threshold;
apply a ground voltage to other bit lines;
apply a word line select voltage input to word line coupled to the second transistor element; and
apply a ground voltage to other word lines.

6. The field programmable gate array (FPGA) of claim 4, further comprising:
a command component configured to erase a programmable resistive element of the programmable resistive elements comprising:
apply a disable voltage input to the latch enable lines;
apply a first input voltage to a select line coupled to the programmable resistive element;
apply a ground voltage to other select lines;
apply a second input voltage to a bit line coupled to a second transistor element that is paired with the programmable resistive element, wherein a difference between the first input voltage and the second input voltage meets an erase voltage threshold;
apply a ground voltage to other bit lines;
apply a word line select voltage input to word line coupled to the second transistor element; and
apply a ground voltage to other word lines.

7. The field programmable gate array (FPGA) of claim 4, further comprising:
a command component configured to program a column of latches from a column of programmable resistive elements comprising:
apply a disable voltage input to the latch enable lines coupled to columns of latches after the column of latches in the series of latches;
apply an enable voltage input to the latch enable lines coupled to columns of latches preceding the column of latches in the series of latches and to the column of latches;
apply a low voltage input to the bit lines;
apply a read voltage input to a select line coupled to the column of programmable resistive elements;
apply a word line select voltage input to a word line coupled to a column of second transistor element line coupled via the first terminals to second electrodes of the column of programmable resistive elements;
apply a ground voltage to other word lines; and
apply a disable voltage input to a latch enable line coupled to the column of latches.

8. The field programmable gate array (FPGA) of claim 4, further comprising:
a second plurality of programmable resistive elements and a third plurality transistor elements, wherein each programmable resistive element of the second plurality of programmable resistive elements includes a first terminal and a second terminal, wherein each transistor element of the third plurality of transistor elements includes a first terminal, a second terminal, and a control, wherein each programmable resistive element of the second plurality of programmable resistive elements is associated with a distinct column of programmable resistive elements and a distinct transistor element of the third plurality of transistor elements, wherein each second terminal of the programmable resistive element of the second plurality of programmable resistive elements are coupled to corresponding first terminals of transistor elements of the third plurality of transistor elements, wherein the first terminals of programmable resistive elements in each column of programmable resistive elements are coupled to the first terminal of a corresponding programmable resistive element of the second plurality of programmable resistive elements, wherein second terminals of transistor elements of the third plurality of transistor elements are coupled to each other and to redundancy line, wherein controls of transistor elements of each column of transistor elements are coupled to a control of a corresponding transistor element of the third plurality of transistor elements associated with a programmable resistive element of the second plurality of programmable resistive elements associated with a corresponding column of programmable resistive elements; and
a correction code component coupled to the bit lines, the inputs of the first latches, and the redundancy line, wherein the correction code component corrects one or more errors in voltage states detected on the bit lines based on a voltage detected on the redundancy line according to an error correction algorithm.

9. The field programmable gate array (FPGA) of claim 1, further comprising at least one additional RRAM array coupled to the RRAM array.

10. The field programmable gate array (FPGA) of claim 1, further comprising a plurality of additional RRAM arrays coupled to the RRAM array.

11. A field programmable gate array, comprising:
a set of input/output junctions;
a set of pass gate transistors configured to selectively activate or deactivate respective ones of the input/output junctions;
a shift register array for programming values to the set of pass gate transistors, each pass gate transistor being activated or deactivated by an associated shift register output of one shift register of the shift register array, and at least one column of shift registers of the shift register array having shift register outputs additionally connected to shift register inputs of another column of shift registers of the shift register array; and
a non-volatile memory array configured to store a data pattern, and comprising at least an array of two-terminal resistive switching memory cells and a set of bitlines connected to shift register inputs of a first column of shift registers of the shift register array, wherein a first subset of the data pattern is transferred by the non-volatile memory on the bitlines to a target column of shift registers of the shift register array in response to a first set of inputs.

12. The field programmable gate array of claim 11, wherein the target column is not the first column, and the data pattern propagates through the first column of shift registers to the target column of shift registers in response to the first set of inputs.

13. The field programmable gate array of claim 11, wherein the target column is not the first column, the data pattern propagates through the first column of shift registers and at least one additional column of shift registers to the target column of shift registers in response to the first set of inputs.

14. The field programmable gate array of claim 11, wherein a second subset of the data pattern is transferred by the non-volatile memory on the bitlines to a second target column of shift registers of the shift register array in response to a second set of inputs.

15. The field programmable gate array of claim 11, wherein additional subsets of the data pattern are iteratively transferred by the non-volatile memory on the bitlines to additional target columns of shift registers of the shift register array in response to an additional set of inputs until the entire data pattern is transferred to the shift register array.

16. The field programmable gate array of claim 15, wherein the data pattern in the shift register array drives controls of the set of pass gate transistors, while concurrently the non-volatile memory array is programmed with another data pattern.

17. The field programmable gate array of claim 16, wherein the other data pattern is transferred to the shift register array in response to further sets of inputs.

18. The field programmable gate array of claim 16, wherein the other data pattern in the shift register array drives the controls of the set of pass gate transistors.

19. A method of programming a field programmable gate array (FPGA), comprising:

setting, by a state machine, a variable I to a value equal to N, where N is an integer equal to a quantity of columns of latches of a shift register array of the FPGA; and iteratively, until I=0:

programming, by the state machine, data from column of RRAM cells I of an RRAM array of the FPGA to column of latches I of the shift register array; and decrementing the value of I by one.

20. The method of claim 19, wherein programming, by the state machine, data from column of RRAM cells I of the RRAM array of the FPGA to column of latches I of the shift register array comprises:

disabling latch enable lines of columns of latches I+1 to N;

enabling latch enable lines of column of latches 1 to I;

applying a read voltage to a select line associated with a column of RRAM cells I;

enabling a word line associated with the column of RRAM cells I; and disabling a latch enable line of column of latches I.

* * * * *